(12) United States Patent
Watkins et al.

(10) Patent No.: US 8,797,018 B2
(45) Date of Patent: Aug. 5, 2014

(54) APPARATUS AND METHOD FOR IDENTIFYING THE PHASE AND TERMINAL FOR POWER SYSTEM DEVICES

(75) Inventors: Matthew B. Watkins, Allen, TX (US); Kenneth G. Workman, Colfax, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 1232 days.

(21) Appl. No.: 12/691,931

(22) Filed: Jan. 22, 2010

(65) Prior Publication Data

US 2011/0181269 A1 Jul. 28, 2011

(51) Int. Cl.
*G01R 25/00* (2006.01)
*G01R 29/18* (2006.01)

(52) U.S. Cl.
CPC ................................ *G01R 29/18* (2013.01)
USPC ............................ 324/76.77; 324/86; 324/66

(58) Field of Classification Search
USPC ................... 324/86, 66, 521, 522–524, 76.77
See application file for complete search history.

(56) References Cited

U.S. PATENT DOCUMENTS

| | | |
|---|---|---|
| 4,164,701 A | 8/1979 | Gulledge |
| 4,314,199 A | 2/1982 | Yamaura |
| 5,493,228 A | 2/1996 | Eriksson |
| 6,483,435 B2 | 11/2002 | Saha |
| 6,525,543 B1 | 2/2003 | Roberts |
| 6,590,397 B2 | 7/2003 | Roberts |
| 7,345,488 B2 | 3/2008 | Fischer |
| 2005/0097373 A1 | 5/2005 | Stoupis |

OTHER PUBLICATIONS

PCTUS2011022098 Patent Cooperation Treaty Written Opinion of the International Searching Authority Mar. 22, 2011.
PCTUS2011022098 Patent Cooperation Treaty International Search Report Mar. 22, 2011.

*Primary Examiner* — Vincent Q Nguyen
(74) *Attorney, Agent, or Firm* — Eugene M. Cummings, P.C.

(57) ABSTRACT

An apparatus and method for identifying the current and voltage phase and terminal for power system devices is described. In one aspect of the present invention, the respective current phase and terminal of two current terminals is identified based on a known phase and known phase angle associated with a third current terminal at the location of the electrical power system. In another aspect of the present invention, the voltage phase and terminal is identified based on a known phase and known phase angle associated with a third current terminal at the location of the electrical power system. In another aspect of the present invention, the respective voltage phase and terminal of three voltage terminals is identified based on known phase and known phase angles associated with first and second current terminals at the location of the electrical power system.

26 Claims, 29 Drawing Sheets

US 8,797,018 B2

APPARATUS AND METHOD FOR IDENTIFYING THE PHASE AND TERMINAL FOR POWER SYSTEM DEVICES

CROSS-REFERENCE TO RELATED APPLICATIONS

None

BACKGROUND OF THE INVENTION

The present invention generally relates to monitoring, metering, protection and control of electrical systems, and more specifically, to an apparatus and method for identifying a phase associated with device terminals at a location of an electrical power system.

Knowledge of the state of an electrical power system is important in order to recognize and understand disturbances in the electrical power system, provide protection functionality, automation, metering, monitoring, and control actions associated therewith. Electrical power systems include a variety of power system elements such as circuit breakers, current transformers, voltage transformers, electrical generators, electrical motors, power transformers, power transmission lines, buses and capacitors, to name a few. Electric power systems also include various automation devices, monitoring devices, control devices, metering devices, and protective devices (e.g. protective relays, remote terminal units (RTUs), recloser controls, sectionalizer controls, meters, etc.).

In most cases, these devices are microprocessor-based or intelligent electronic devices (IEDs) that provide proper metering, monitoring and control functionality from the determination and/or processing of current and/or voltage signals from the power system. As shown in FIG. 1, modern power systems are three-phase systems wherein each phase associated with a voltage $V_A$ 102, $V_B$ 104, $V_C$ 106 is offset from the others by about a 120° phase shift. Similarly, as shown in FIG. 2, modern power systems are three-phase systems wherein each phase associated with a current $I_A$ 202, $I_B$ 204, $I_C$ 206 is offset from the others by about a 120° phase shift. Each phase is assigned a phase designation, typically A, B and C. The correct and proper execution of monitoring, control, automation, metering and protective devices is dependent on the proper identification of the phase associated with each device current or voltage terminal connected to the electrical power system.

Nevertheless, phase identification is often difficult to ascertain for certain locations in the power system. In one example, a recloser is a device including a mechanism for controlling a circuit breaker associated with a location in the power system. Reclosers are typically used in coordinated protection schemes for overhead power lines. For example, when a fault is detected at a location on the power line, a protective device such as a protective relay or recloser control would open a circuit breaker or recloser associated therewith to isolate the fault from the remainder of the power system. Were the fault is temporary, the protective relay or recloser control would issue an automatic reclose command to the circuit breaker or recloser to resume normal operation. When the fault is permanent, the protective relay or recloser control goes through a preset open-close-open sequence to lock out the circuit. After the fault is cleared, the protective relay or recloser control would be used to close the circuit breaker or recloser to resume normal operation.

Reclosers require a proper connection to a three-phase power system. Accordingly, reclosers require the proper identification of the phase associated with each of its current or voltage terminals connected to the electrical power system. Such phase identification proves difficult as the recloser can require six voltage connections and three current connections at a location on the power system. For example, in FIG. 3, at a location in a power system 300, a recloser control 302 (e.g., protective relay) is associated with a power system apparatus 304 (e.g., recloser or circuit breaker). For proper control of the power system apparatus 304, the recloser control 302 requires a proper identification and three-phase voltage connection at the source ($VST_1$, $VST_2$, $VST_3$), a proper identification and three-phase voltage connection at the load ($VLT_1$, $VLT_2$, $VLT_3$), and a proper identification and three-phase current connection at the load ($CT_1$, $CT_2$, $CT_3$).

Accordingly, it is an aspect of the present invention to provide a method power system for identifying a phase associated with device terminals at a location of an electrical power system.

SUMMARY OF THE INVENTION

An apparatus and method for identifying the current and voltage phase and terminal for power system devices is described. In aspect of the present invention, the respective current phase and terminal of two current terminals is identified based on a known phase and known phase angle associated with a third current terminal at the location of the electrical power system. In another aspect of the present invention, the voltage phase and terminal is identified based on a known phase and known phase angle associated with a third current terminal at the location of the electrical power system. In another aspect of the present invention, the respective voltage phase and terminal of three voltage terminals is identified based on known phase and known phase angles associated with first and second current terminals at the location of the electrical power system.

DETAILED DESCRIPTION OF THE PREFERRED EMBODIMENTS

In contrast to existing systems, the present invention provides a method for identifying a phase associated with device terminals at a location of an electrical power system. This method may be implemented into various power system devices for automatic phase and terminal identification and configuration.

Figure 1:
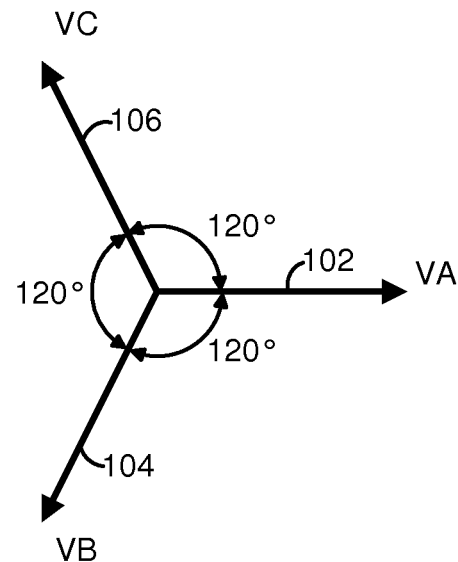
FIG. 1 is a phase angle diagram a three-phase voltage system having a wherein each phase associated with a voltage is offset from the others by about a 120° phase shift.
Figure 2:
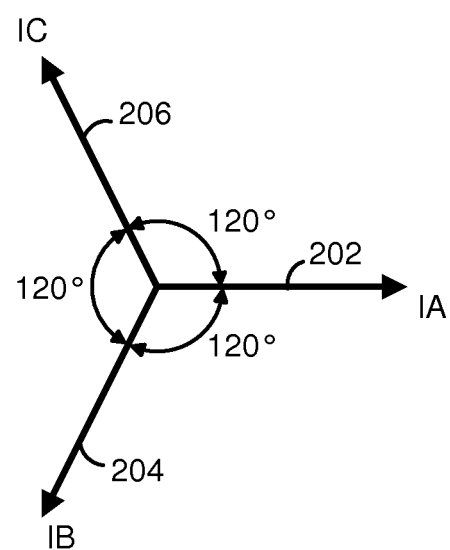
FIG. 2 is a phase angle diagram a three-phase current system having a wherein each phase associated with a current is offset from the others by about a 120° phase shift.
Figure 3:
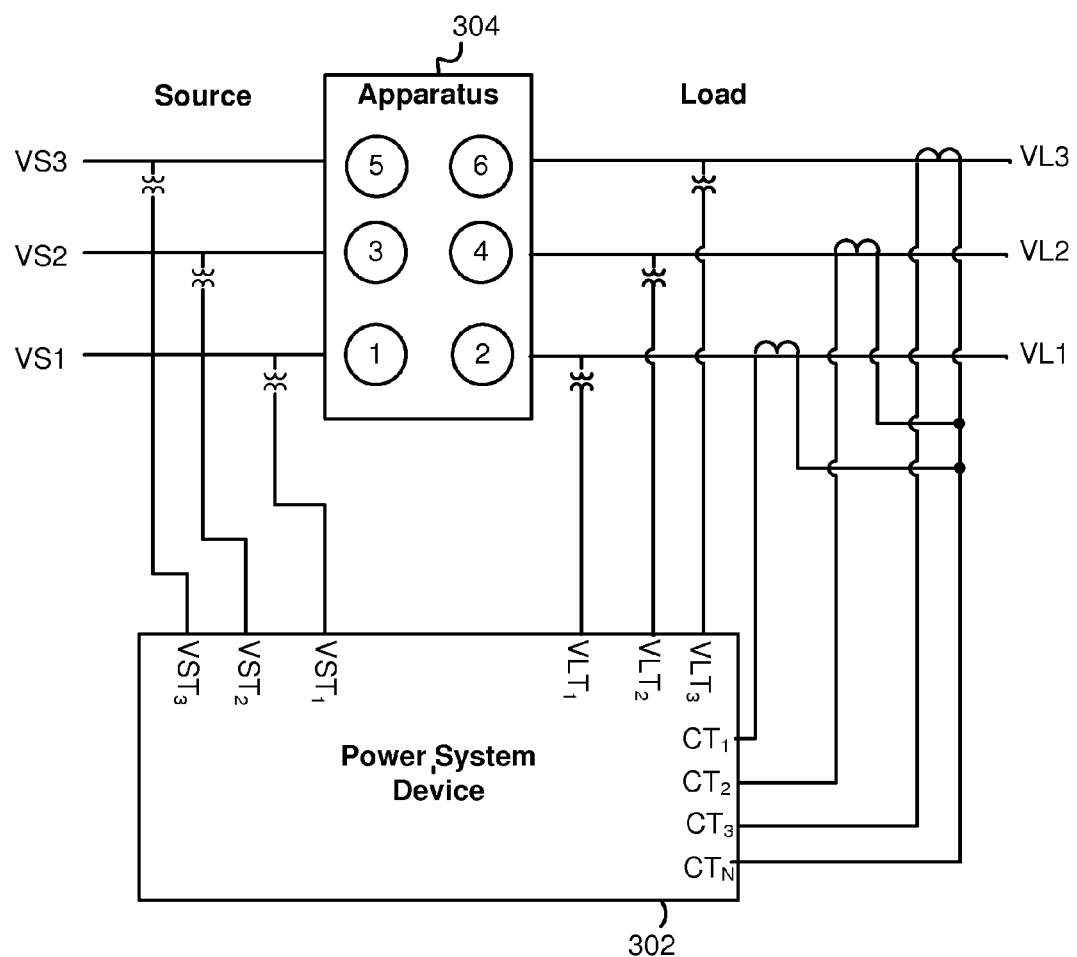
FIG. 3 is a block diagram of a location in a power system having a recloser control associated with a power system recloser (apparatus).
Figure 4:
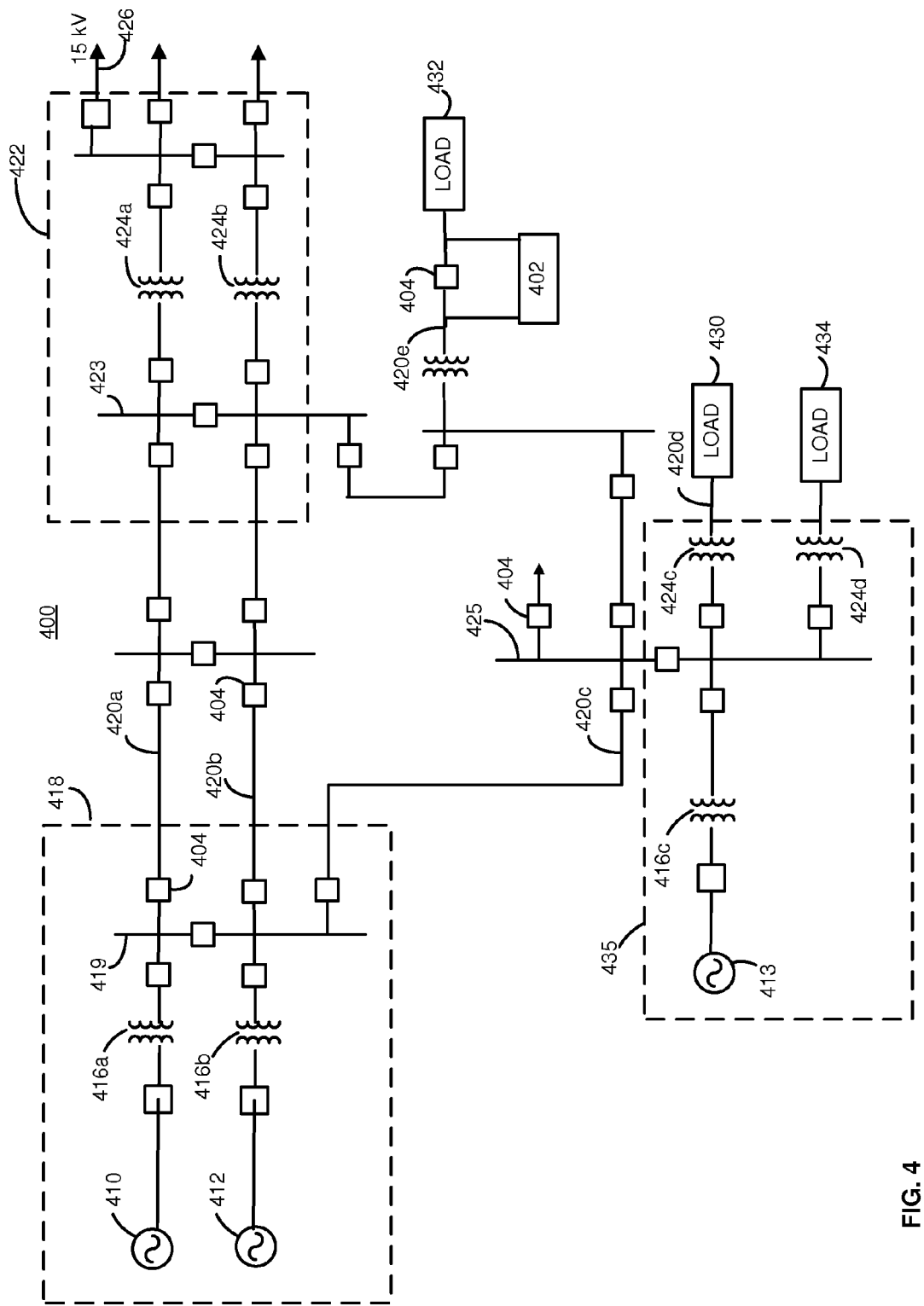
FIG. 4 is a single line schematic diagram of a power system that may be utilized in a typical wide area.

FIG. 4 is a single line schematic diagram of a power system 400 that may be utilized in a typical wide area. The power system 400 includes, among other things, three synchronous generators 410, 412 and 413, configured to generate three-phase sinusoidal waveforms such as 12 kV sinusoidal waveforms, three step-up power transformers 416a, 416b and 416c, configured to increase the generated waveforms to a higher voltage sinusoidal waveforms such as 138 kV sinusoidal waveforms and a number of circuit breakers 404. The step-up power transformers 416a, 416b and 416c operate to provide the higher voltage sinusoidal waveforms to a number of long distance transmission lines such as the transmission lines 420a, 420b, 420c and 420d. In an embodiment, a first substation 418 may be defined to include the two synchronous generators 410 and 412, the two step-up power transformers 416a and 416b and associated circuit breakers 404, all interconnected via a first bus 419. A second substation 435 may be defined to include the synchronous generator 413, the step-up power transformer 416c and associated circuit breakers 404, all interconnected via a second bus 425. At the end of the long distance transmission lines 420a, 420b, a third substation 422 may be defined to include two step-down power transformers 424a and 424b configured to transform the higher voltage sinusoidal waveforms to lower voltage sinusoidal waveforms (e.g., 15 kV) suitable for distribution via one or more distribution lines 426 to loads such as a load 432. The second substation 435 also includes two step-down power transformers 424c and 424d to transform the higher voltage sinusoidal waveforms, received via the second bus 425, to lower voltage sinusoidal waveforms suitable for use by respective loads 430 and 434.

A number of intelligent electronic devices (IED) are connected at various points in the electric power system 400. For ease of discussion however, only one IED 402 is shown operatively connected to the transmission line 420e. In general, an IED can be configured to perform one or more of power system protection (e.g., a line current differential protection), automation (e.g., reclosing a circuit breaker), control (e.g., capacitor bank switching) and metering (e.g., power consumption calculation). In one example, IED 402 may be a recloser control or protective relay for controlling the operation of circuit breaker 404.

Figure 5A:
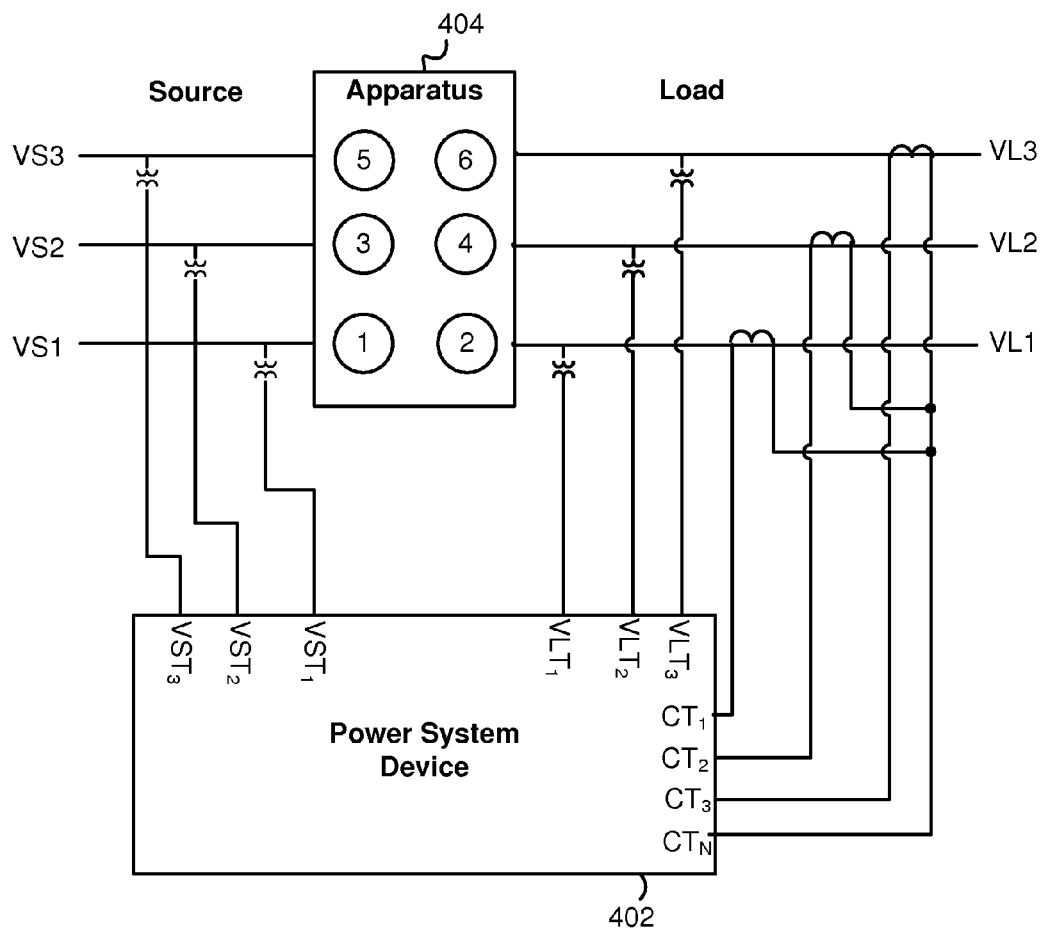
FIG. 5a is a block diagram of a location of the power system associated with IED and circuit breaker.

FIG. 5a is a block diagram of the location of the power system 400 associated with IED 402 (e.g., recloser control or protective relay) and circuit breaker 404. The power system 400 is a three-phase system. Accordingly, transmission line 420e is comprised of three lines, wherein each line is associated with a phase. The correct and proper execution of IED 402 is dependent on the proper identification of the phase associated with each device current or voltage terminal connected to the electrical power system. For example, in FIG. 5, IED 402 requires a proper identification and three-phase voltage connection at the source ($VST_1$, $VST_2$, $VST_3$), a proper identification and three-phase voltage connection at the load ($VLT_1$, $VLT_2$, $VLT_3$), and a proper identification and three-phase current connection at the load ($CT_1$, $CT_2$, $CT_3$).

Figure 5B:
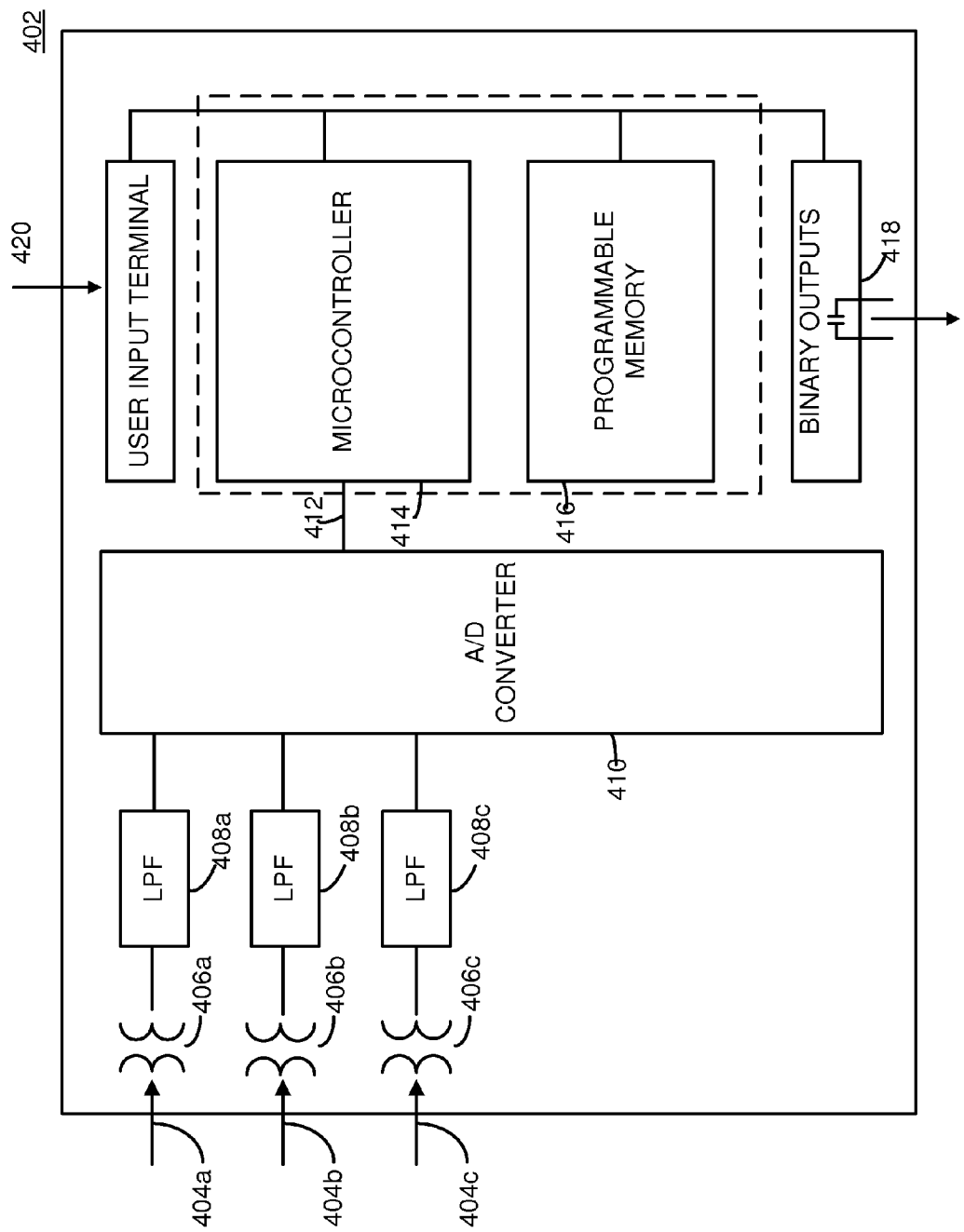
FIG. 5b is a block diagram of the IED of FIG. 5a adapted to identify the current and voltage phase and terminal for power system devices in accordance with an aspect of the present invention.

FIG. 5b is a block diagram of the IED 402 of FIG. 4. In the IED 402, the voltage or current signals 404 a, b, c are sampled via transformers 406 a, b, c. The samples are filtered using filters 408 a, b, c and then digitized with ND converter 410 to form digitized signal sample streams 412 suitable for use by a microprocessor 414 (or field programmable gate array-FPGA). The microprocessor 414 processes the digitized signal sample streams 412 to provide automation, control, monitoring and protection functionality to the associated apparatus 404 of FIG. 5a. The microprocessor 414 may be adapted to provide control, automation, monitoring or protection signals to the associated apparatus 404 via the binary output 418.

Instructions for identifying and configuring the three-phase voltage/current connection of the associated apparatus 404 may be stored in programmable memory 416. The programmable memory 416 may be adapted such that the instructions stored therein may be adapted as desired. These instructions may be processed by the microprocessor 414. These instructions for identifying and configuring the three-phase voltage/current connection are described in detail below. A user may input values and/or instructions to be processed by the microprocessor 414 through user input terminal 420.

Although it is shown to be associated with a recloser control, the present invention IED may be associated with other elements of the power system including, but not limited to, current transformers, voltage transformers, electrical generators, electrical motors, power transformers, power transmission lines, buses and capacitors, circuit breakers, switches, or automated, motor operated switches to name a few.

Figure 6A:
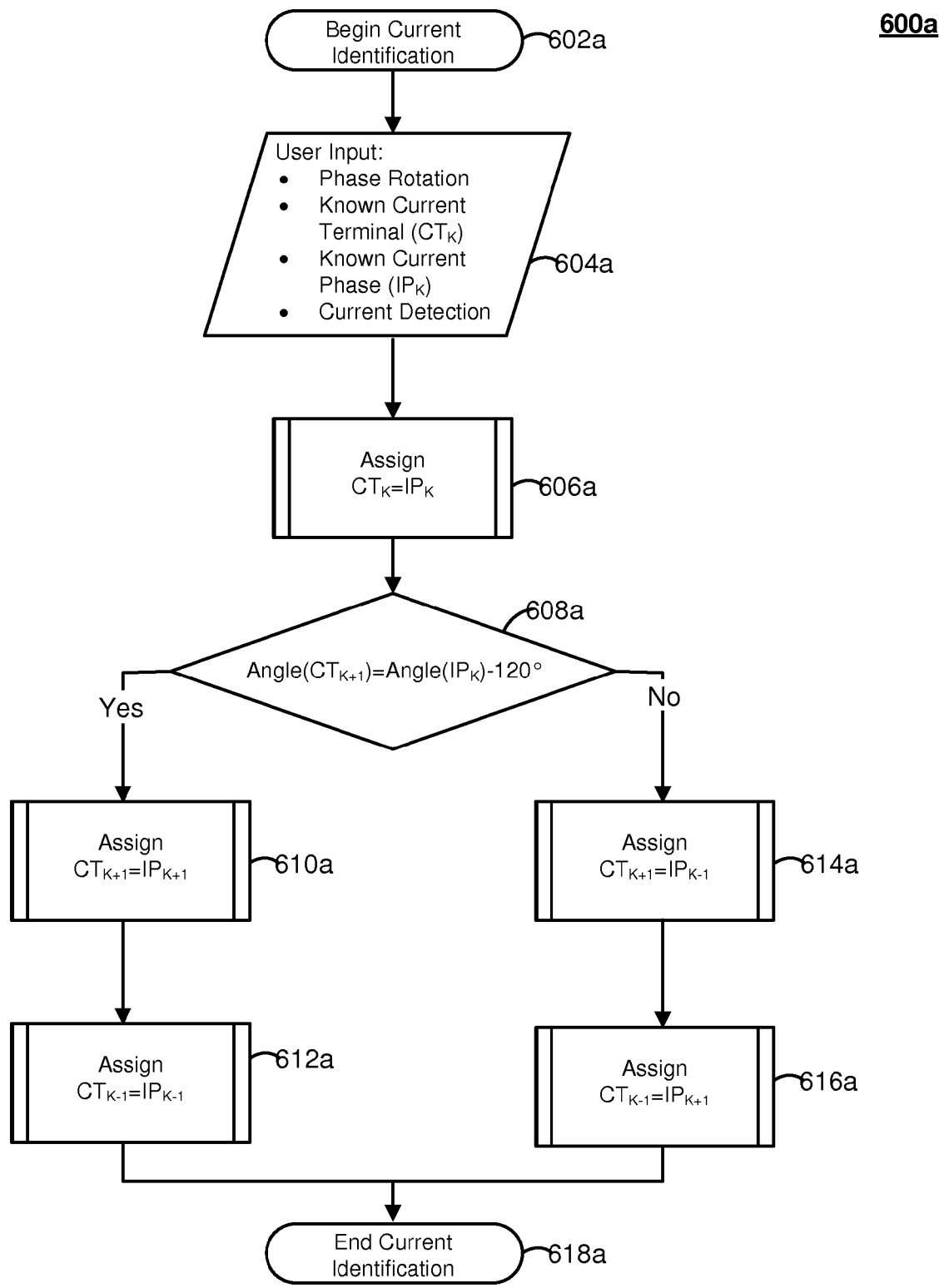
FIG. 6a is flow chart of instructions for the IED of FIG. 5 for identifying the current phase and terminal for power system devices in accordance with an aspect of the present invention.

As shown in FIG. 6a, the instructions processed by the microprocessor 414 of FIGS. 5a and 5b may include a method for identifying the phase associated with second and third current terminals at a location of an electrical power system based on a known phase and known phase angle associated with a first current terminal at the location of the electrical power system. Typically, at locations of the electrical power system, at least one phase of the three distribution lines would be known. For example, it is common for overhead distribution lines that the B-phase line be situated between the A-phase and C-phase lines. The current terminals may be placed on the source or load side of device 404. Typically, the other known or measured quantities include phase rotation (e.g., ABC or CBA).

In order to begin the process of identifying the phase associated with second and third current terminals as shown at 602a, a user would input into the IED 402 via the user input terminal 420 or setting software phase rotation and the known phase corresponding to the known first current terminal as shown at 604a. The microprocessor of the IED would assign the known first current terminal with the known phase ($CT_k = IP_k$) as shown at 606a. Next, the phase angles associated with the known first current terminal (Angle ($CT_k$)) and the second current terminal (Angle ($CT_{k+1}$)) are acquired. As shown in steps 608a, 610a, and 612a, when the phase angle associated with the second current terminal ($CT_{k+1}$) is about equal to the phase angle associated with the known first current terminal (Angle ($CT_k$)) minus about 120°, the phase associated with the second current terminal ($CT_{k+1}$) is assigned as the next sequential phase from the known phase associated with the known first current terminal ($IP_{k+1}$), whereas the phase associated with the third current terminal ($CT_{k-1}$) is assigned as the previous sequential phase from the known phase associated with the known first current terminal ($IP_{k-1}$). As shown in steps 608a, 614a, and 616a, when the phase angle associated with the second current terminal ($CT_{k+1}$) is not about equal to the phase angle associated with the known first current terminal (Angle ($CT_k$)) minus about 120°, the phase associated with the second current terminal ($CT_{k+1}$) is assigned as the previous sequential phase from the known phase associated with the known current terminal ($IP_{k-1}$), whereas the phase associated with the third current terminal ($CT_{k-1}$) is assigned as the next sequential phase from the known phase associated with the known current terminal ($IP_{k+1}$). Although FIG. 6a shows phase identification for only three current terminals, the method outlined in this invention may be used for identifying phase values for power system arrangements having more or less unknown current terminals.

Assigning the next or previous sequential phase may be based on the phase rotation. For example, for an ABC phase rotation, the next sequential phase from the B-phase is the C-phase, whereas the previous sequential phase from the B-phase is the A-phase. In another example, for a CBA phase rotation, the next sequential phase from the B-phase is the A-phase, whereas the previous sequential phase from the B-phase is the C-phase.

Figure 6B:
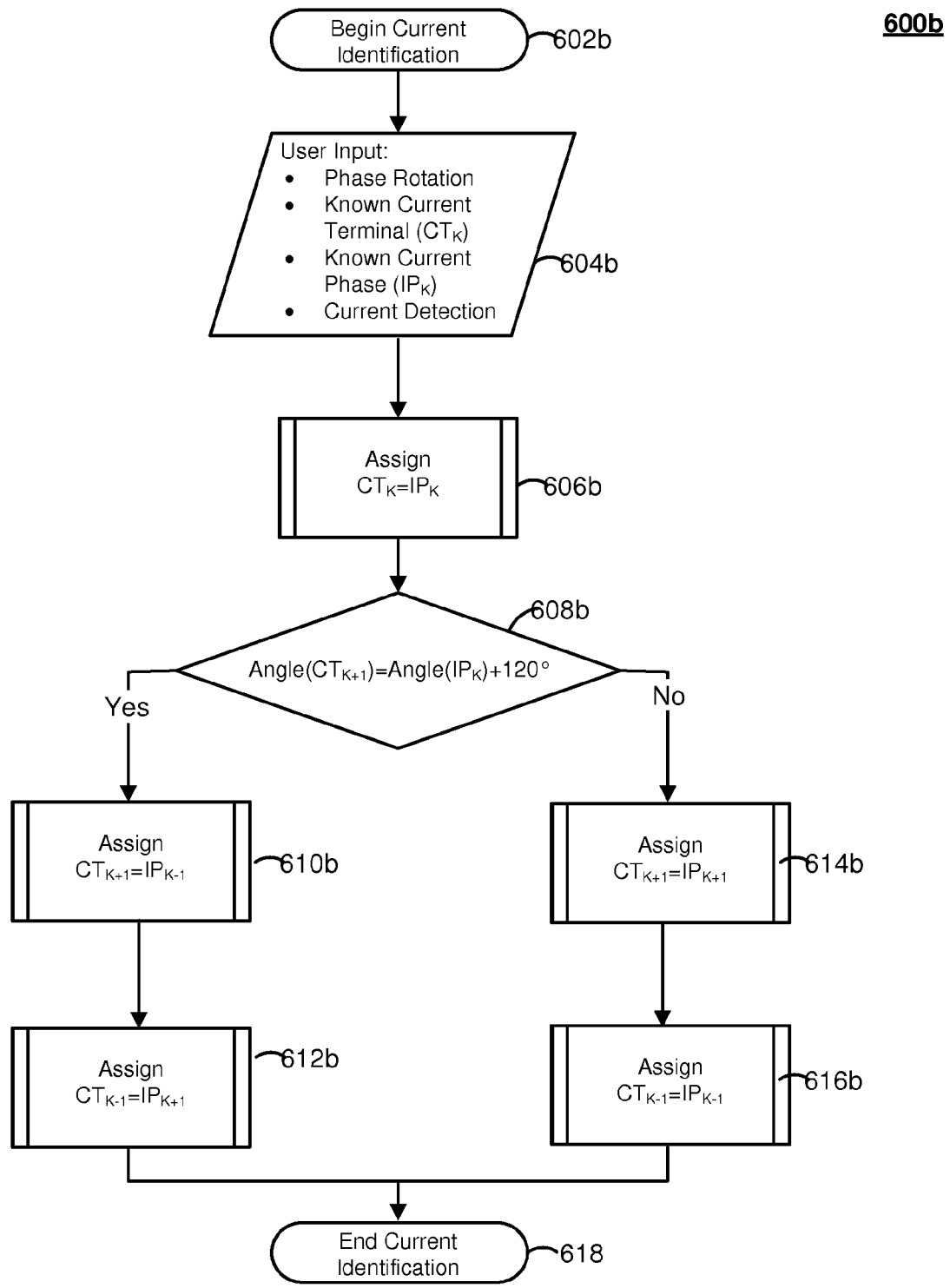
FIG. 6b is flow chart of instructions for the IED of FIG. 5 for identifying the current phase and terminal for power system devices in accordance with an aspect of the present invention.
Figure 7:
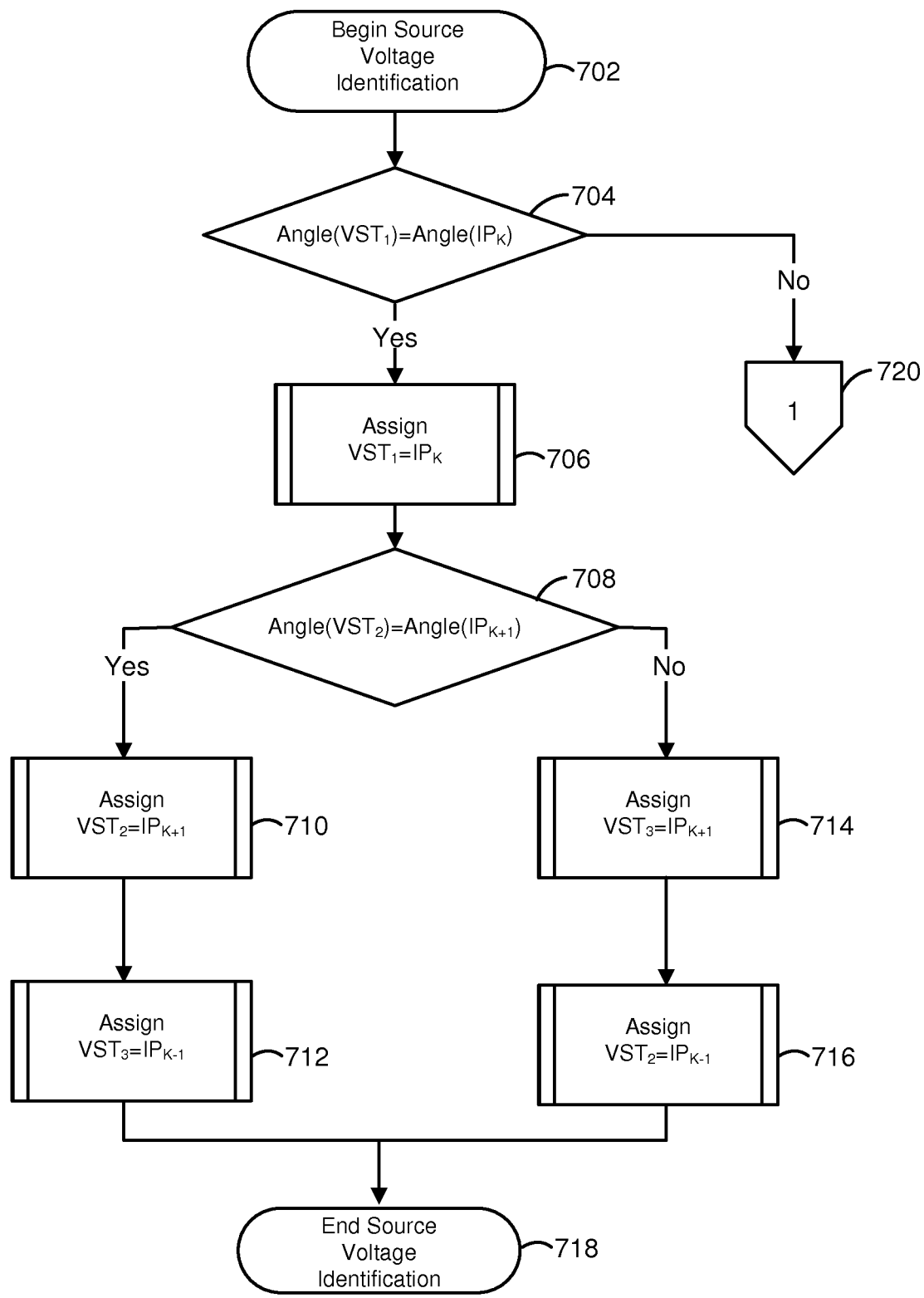
FIGS. 7 and 8 are flow charts of instructions for the IED of FIG. 5 for identifying the voltage phase and terminal for power system devices in accordance with an aspect of the present invention.
Figure 8:
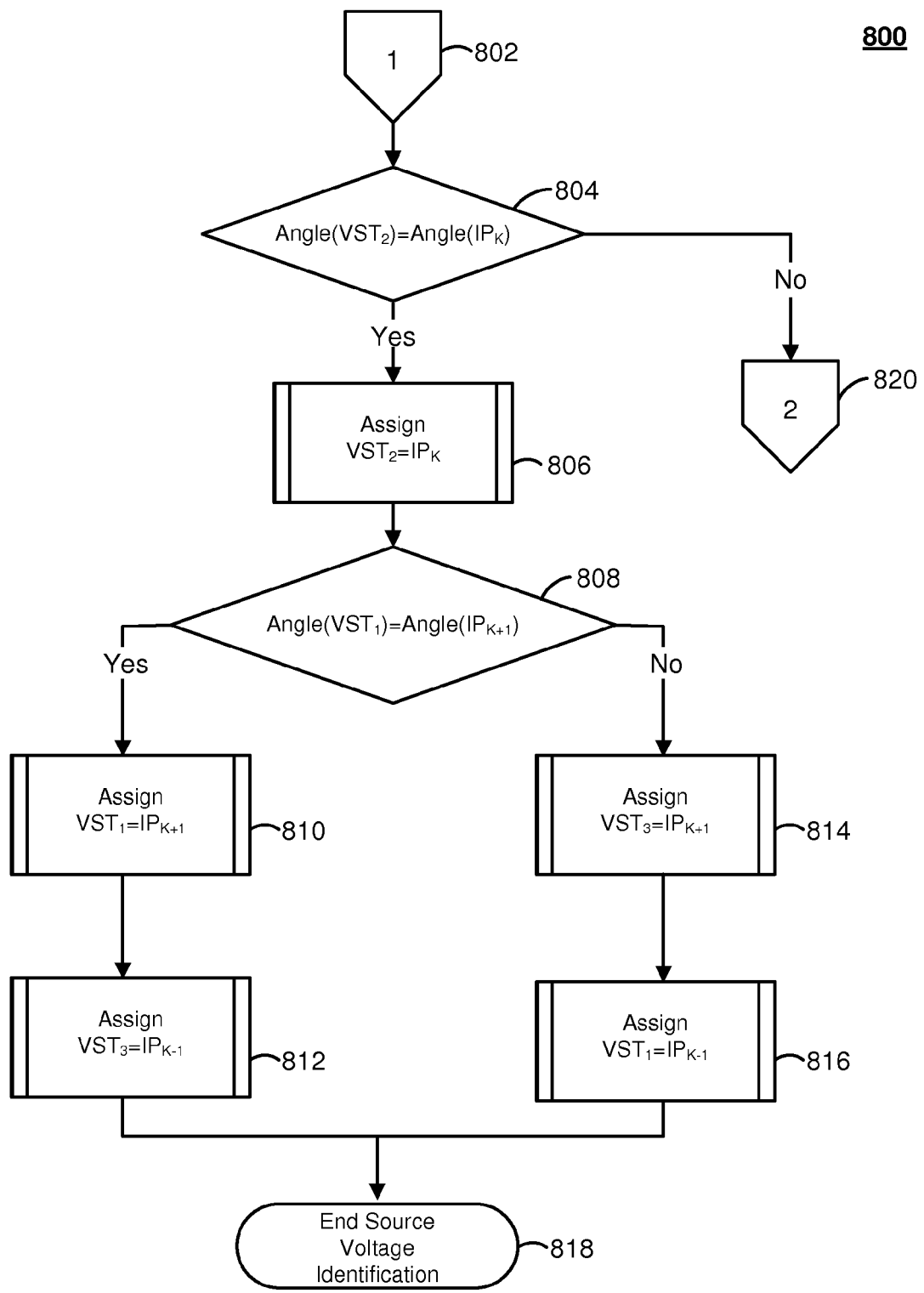
Figure 9:
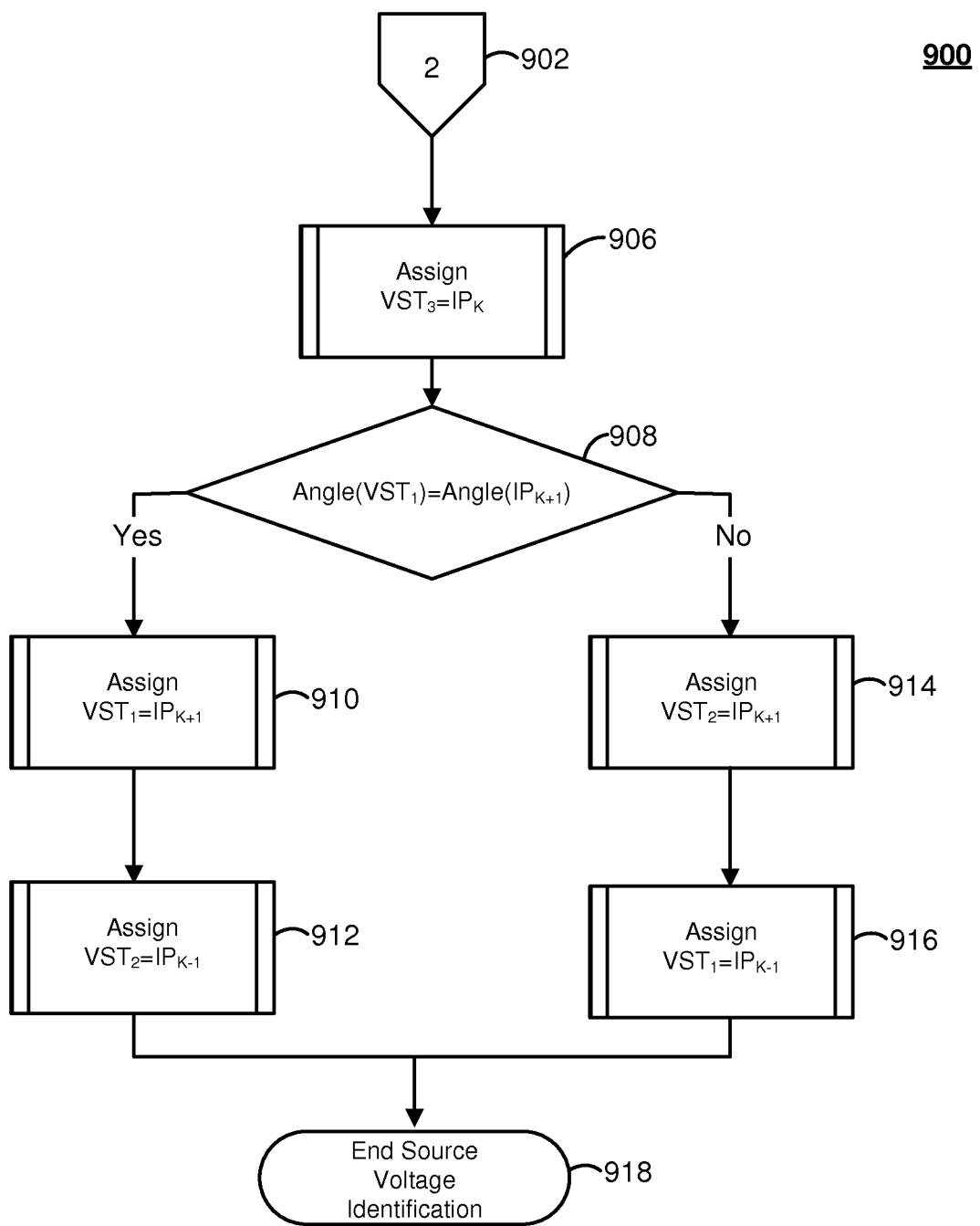
FIGS. 9 to 12 are flow charts of instructions for the IED of FIG. 5 for identifying the voltage phase and terminal for power system devices in accordance with an aspect of the present invention.
Figure 10:
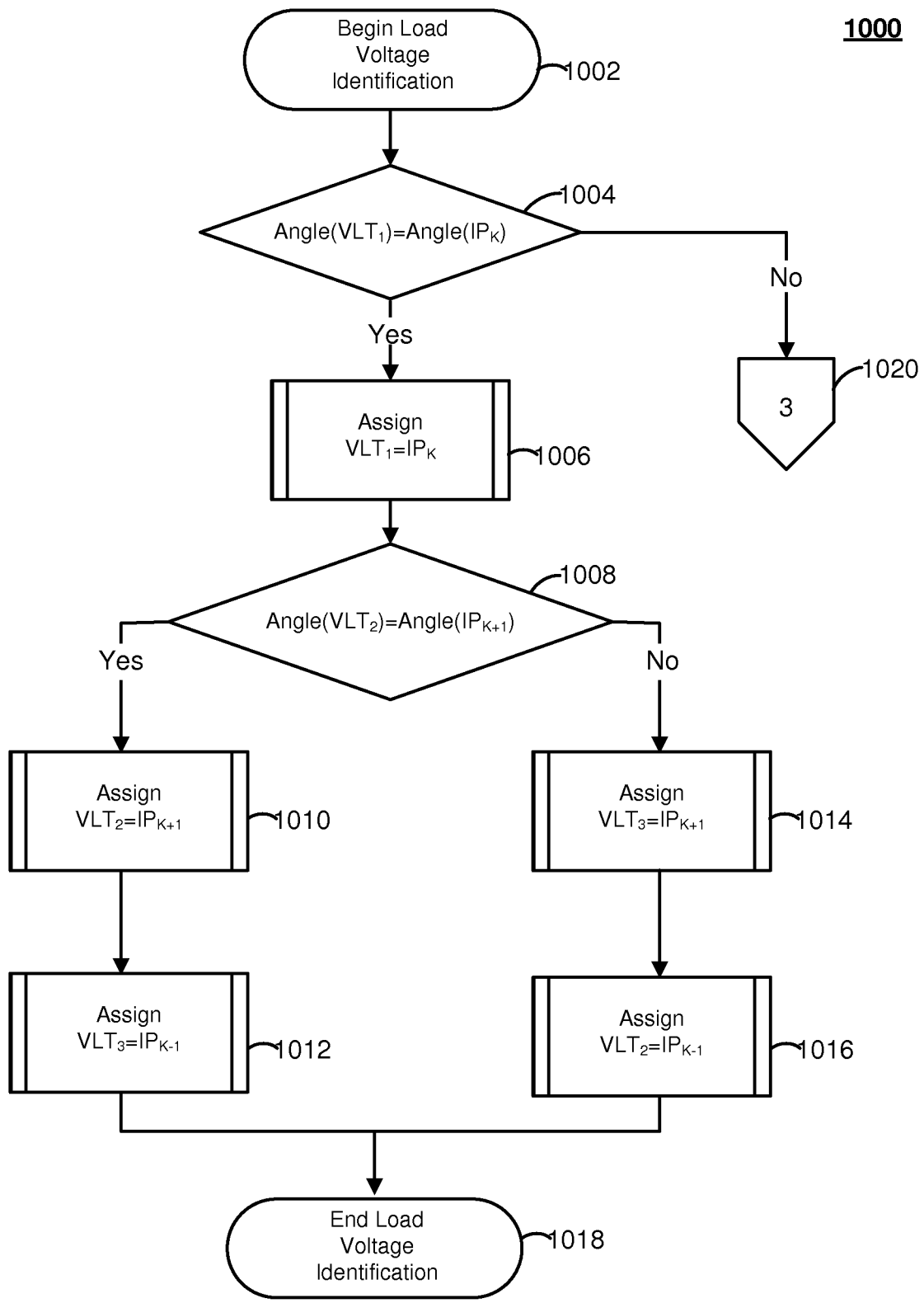
Figure 11:
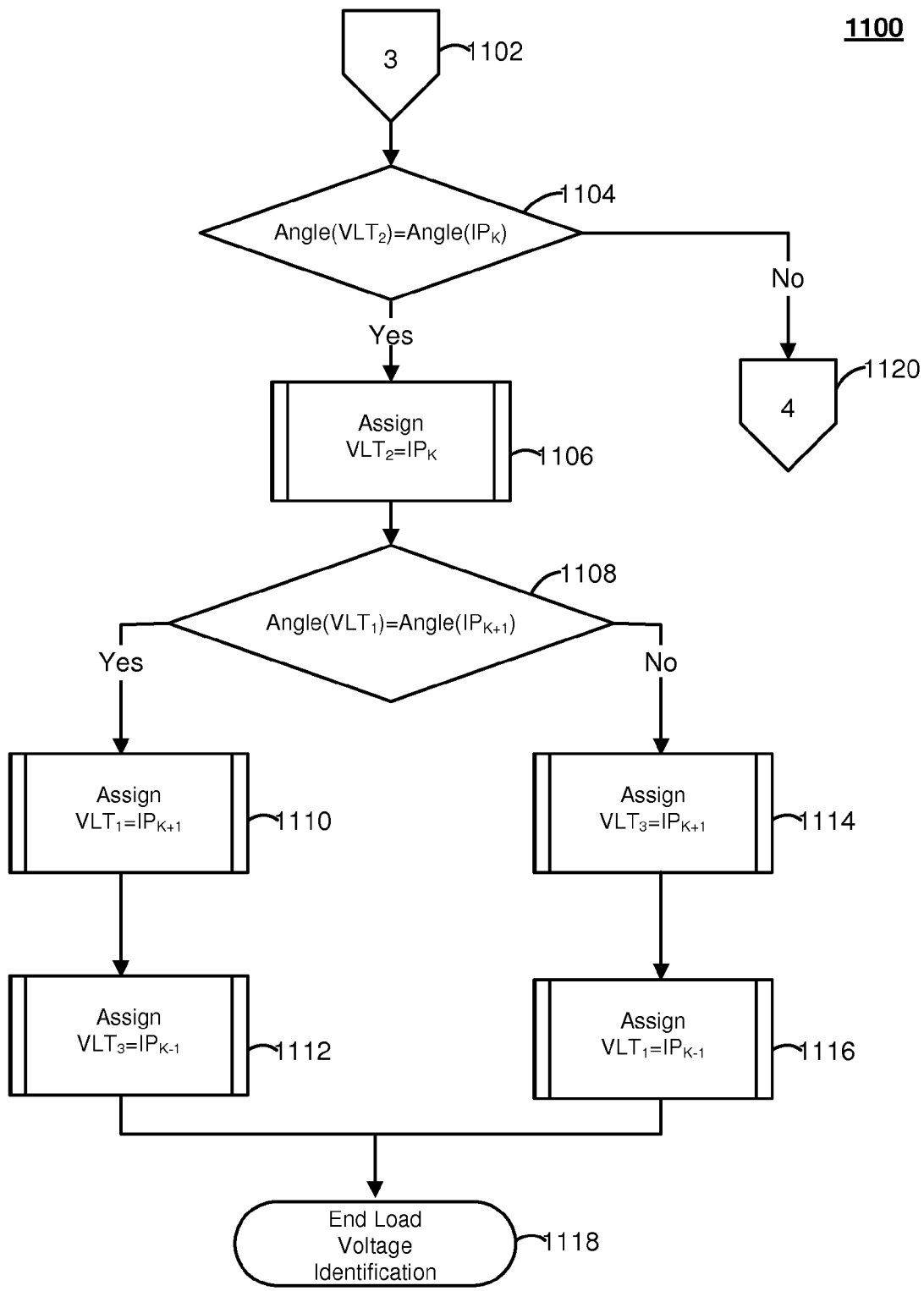
Figure 12:
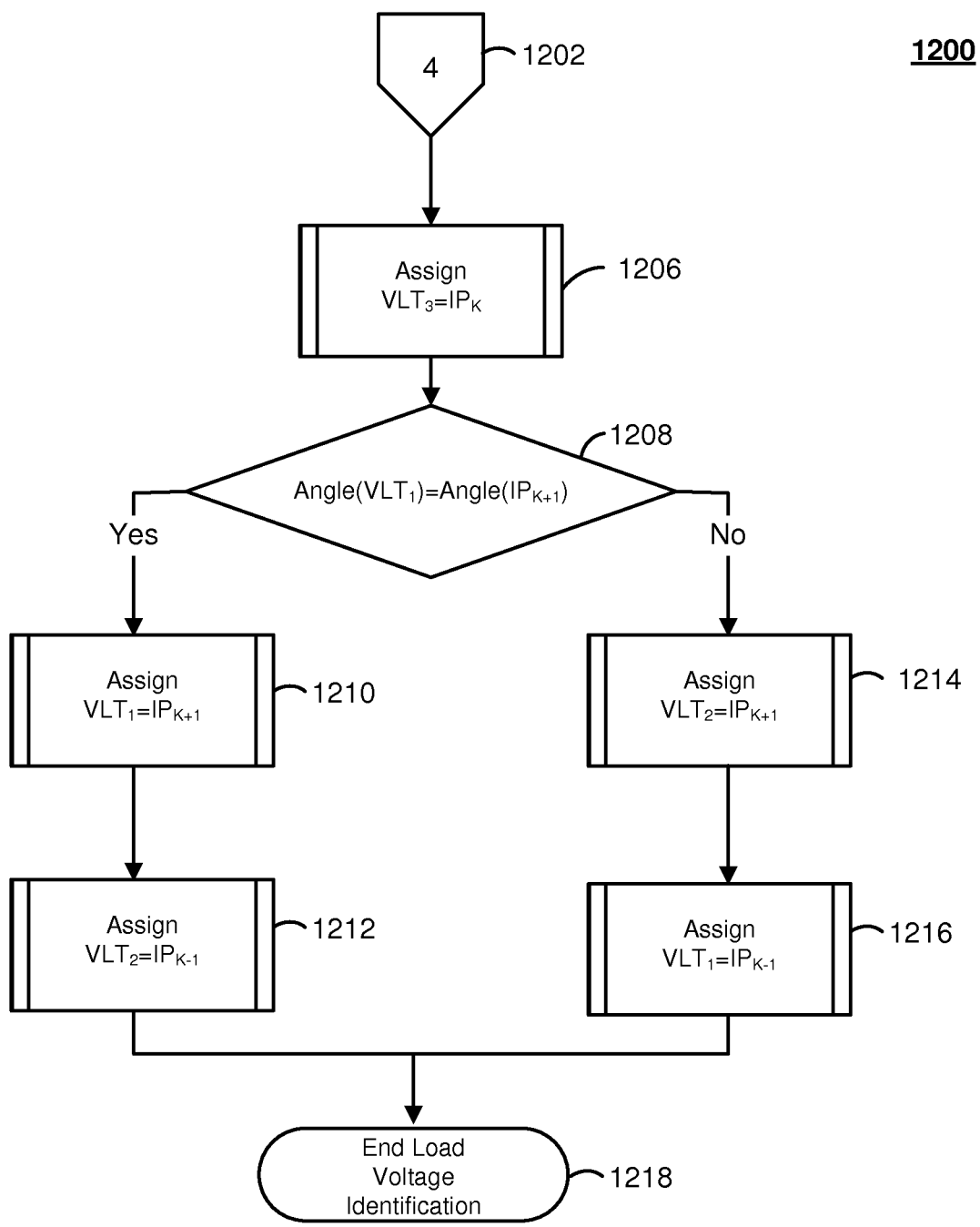

FIG. 6b illustrates yet another embodiment of instructions 606b utilized by the IED 402 for identifying the phase associated with second and third current terminals at a location of an electrical power system based on a known phase and known phase angle associated with a first current terminal at the location of the electrical power system. In order to begin the process of identifying the phase associated with second and third current terminals as shown at 602b, a user would input into the IED 402 via the user input terminal 420 or setting software phase rotation and the known phase corresponding to the known first current terminal as shown at 604b. The microprocessor of the IED would assign the known first current terminal with the known phase ($CT_k = IP_k$) as shown at 606b. Next, the phase angles associated with the first current terminal (Angle ($CT_k$)) and second current terminal (Angle ($CT_{k+1}$)) are acquired. As shown in steps 608b, 610b, and 612b, when the phase angle associated with the second current terminal ($CT_{k+1}$) is about equal to the phase angle associated with the known first current terminal (Angle ($CT_k$)) plus about 120°, the phase associated with the second current terminal ($CT_{k+1}$) is assigned as the previous sequential phase from the known phase associated with the known current terminal ($IP_{k-1}$), whereas the phase associated with the third current terminal ($CT_{k-1}$) is assigned as the next sequential phase from the known phase associated with the known current terminal ($IP_{k+1}$). As shown in steps 608b, 614b, and 616b, when the phase angle associated with the second current terminal ($CT_{k+1}$) is not equal to the phase angle associated with the known first current terminal (Angle ($CT_k$)) plus about 120°, the phase associated with the second current terminal ($CT_{k+1}$) is assigned as the next sequential phase from the known phase associated with the known current terminal ($IP_{k+1}$), whereas the phase associated with the third current terminal ($CT_{k-1}$) is assigned as the previous sequential phase from the known phase associated with the known current terminal ($IP_{k-1}$). As discussed above, assigning the next or previous sequential phase may be based on the phase rotation. Although FIG. 6b shows phase identification for only three current terminals, the method outlined in this invention may be used for identifying phase values for power system arrangements having more or less unknown current terminals.

As shown in FIGS. 7-12, the instructions utilized by the IED 402 of FIG. 5 may further include a method for identifying the phase associated with each of the voltage terminals at a location of an electrical power system based on the known phases of each of the current terminals identified with respect to FIGS. 6a and 6b. The phases of each of the current terminals approximately correspond to a phase of a voltage terminal. Accordingly, the instructions generally include a method for determining the phase associated with a voltage terminal at a location of an electrical power system based on a known phase and known phase angle associated with a current terminal at the location of the power system. During this process, the phase angle associated with the voltage terminal is determined. The phase angle associated with the voltage terminal is then compared to the known phase angle of one of the known current terminals. When the phase angle associated with the voltage terminal is about equal to the phase angle associated with a particular current terminal, the phase associated with the voltage terminal is assigned as the known phase associated with that particular current terminal as shown at 706, 806, 906, 1006, 1106, 1206. When the phase angle associated with the voltage terminal is not about equal to the phase angle associated with the current terminal, the phase angle of another voltage terminal is compared to the known phase angle of the current terminal as shown at 720, 820, 1020, 1120.

When there is an initial match as shown at 706, 806, 906, 1106, 1206, the phase angle of another voltage terminal is compared to another known phase angle of another known current terminal. When the phase angle associated with the other voltage terminal is about equal to the other phase angle associated with the other particular current terminal, the phase associated with the voltage terminal is assigned as the known phase associated with that particular current terminal as shown at 710, 810, 910, 1010, 1110, 1210. In this case, the phase for the last remaining voltage terminal is assigned as the known phase associated with the last particular current terminal as shown at 712, 812, 912, 1012, 1112, 1212. When the phase angle associated with the other voltage terminal is not about equal to the other phase angle associated with the other particular current terminal, the phase angle of the voltage terminal is assigned as the known phase associated with the last particular current terminal as shown at 714, 814, 914, 1014, 1114, 1214. In this case, the phase for the last remaining voltage terminal is assigned as the known phase associated with the other particular current terminal as shown at 714, 814, 914, 1014, 1114, 1214.

Although FIGS. 7-12 show phase identification for only three voltage terminals at the source and three voltage terminals at the load, the method outlined in this invention may be used for identifying phase values for power system arrangements having more or less unknown voltage terminals.

Using the instructions to identify the phases for the voltage and current terminals, the IED 402 may in turn be configured to acquire and otherwise process data from each of the terminals in order to provide protection functionality, automation, metering, monitoring, and control actions associated therewith.

In one example, IED 402 of FIGS. 5a and 5b may be a recloser control 402 or protective relay for controlling a circuit breaker 404 or recloser. When a fault is detected at a location on the power line, a protective device such as a protective relay or recloser control 402 would open a circuit breaker 404 or recloser associated therewith to isolate the fault from the remainder of the power system. When the fault is temporary, the protective relay or recloser control 402 would issue an automatic reclose command to the circuit breaker 404 or recloser to resume normal operation. When the fault is permanent, the protective relay or recloser control 402 goes through a preset open-close-open sequence to lock out the circuit. After the fault is cleared, the protective relay or recloser control 402 control would be used to close the circuit breaker 404 or recloser to resume normal operation.

For proper operation, recloser control 402 requires the proper identification of the phase associated with each of its current or voltage terminals connected to the electrical power system 400. Recloser control 402 requires a proper identification and three-phase voltage connection at the source ($VST_1$, $VST_2$, $VST_3$), a proper identification and three-phase voltage connection at the load ($VLT_1$, $VLT_2$, $VLT_3$), and a proper identification and three-phase current connection at the load ($CT_1$, $CT_2$, $CT_3$). In order to properly identify and configure the three-phase voltage/current connection of the device, the recloser control 402 includes instructions as described above.

As shown in FIG. 6a, the instructions utilized by the recloser control 402 of FIG. 5 may include a method for identifying the phase associated with second and third current terminals at a location of an electrical power system based on a known phase and known phase angle associated with a first current terminal at the location of the electrical power system. Typically, for recloser installations, it is common for overhead transmission lines that the B-phase line be situated between the A-phase and C-phase lines.

In order to begin the process of identifying the phase associated with first and second current terminals as shown at 602a, using the user input terminal 420, a user would input into the recloser control 402 phase rotation and the known phase corresponding to the known current terminal as shown at 604a. For example, user may enter that the B-phase is associated with the first current terminal ($I_1$) and that there is an ABC phase rotation. The microprocessor of the recloser would assign the known current terminal with the known phase ($CT_1=IP_1$) as shown at 606. For example, the microprocessor may assign phase $I_1=B$. Next, the phase angle associated with the second current terminal (Angle ($CT_2$)) would be acquired (e.g., Angle ($CT_2$)=100°). Also, the phase angle of the known current terminal (Angle ($CT_1$)) is acquired (e.g., Angle ($CT_1$)=223.4°). As shown in steps 608a, 610a, and 612a, because the phase angle associated with the second current terminal (Angle ($CT_2$)=100°) is about equal to the phase angle associated with the first current terminal (Angle ($CT_1$)=223.4°) minus about 120°, the phase associated with the second current terminal ($CT_2$) is assigned as the next sequential phase from the known phase associated with the known current terminal ($IP_2=C$), whereas the phase associated with the third current terminal ($CT_3$) is assigned as the previous sequential phase from the known phase associated with the known current terminal ($IP_3=A$).

As shown in FIGS. 7-12, the instructions utilized by the recloser control 402 of FIG. 5 may additionally include a method for identifying the phase associated with each of the voltage terminals at a location of an electrical power system based on the known phases of each of the current terminals identified with respect to FIGS. 6a and 6b. The phases of each of the current terminals approximately correspond to a phase of a voltage terminal. Accordingly, the instructions generally include a method for determining the phase associated with a voltage terminal at a location of an electrical power system based on a known phase and known phase angle associated with a current terminal at the location of the power system.

During this process, the phase angles associated with the voltage terminals at the source are determined. For example, the phase angle of $VST_1$ is determined to be 105°. This phase angle is then compared to the known phase angle of one of the known current terminals (e.g., $IP_1$ which equals) 223.4°) as shown at 704. Because the Angle($VST_1$) is not equal to Angle ($IP_1$), the phase angle for $VST_2$ is determined and compared to the known phase angle of $IP_1$ as shown at 720 and 804. Angle($VST_2$) is determined to be 220.4°. Because Angle ($VST_2$) equals about Angle($IP_1$), $VST_2$ is assigned the phase corresponding to $IP_1$, which is the B-phase as shown at 806. Angle($VST_1$) is then compared to Angle($IP_2$) as shown at 808. Because Angle($VST_1$) equals about Angle($IP_2$), $VST_1$ is assigned the phase corresponding to $IP_2$, which is the C-phase as shown at 810. $VST_3$ is then assigned to the phase corresponding to $IP_3$, which is the A-phase as shown at 812. A similar method may be used to determine the phases corresponding to the voltage terminals at the load $VLT_1$, $VLT_2$ and $VLT_3$ Using the instructions described above to identify the phases for the voltage and current terminals, recloser control 402 may in turn be configured to acquire and otherwise process data from each of the terminals in order to provide automation of the circuit breaker 404 associated therewith.

The above description and example discuss an embodiment of the described invention where the current nodes in FIG. 5 are used to determine the phase of the source and load voltage nodes; however, this is not the only method to determine the phase of the voltage in the system. Two other embodiments of instructions will be discussed. The first of these two alternate embodiments is where the phase of the load voltage and the current are found using the phase of the source voltage. The second of these two alternate embodiments is where the phase of the source voltage and the current are found using the phase of the load voltage.

Figure 13A:
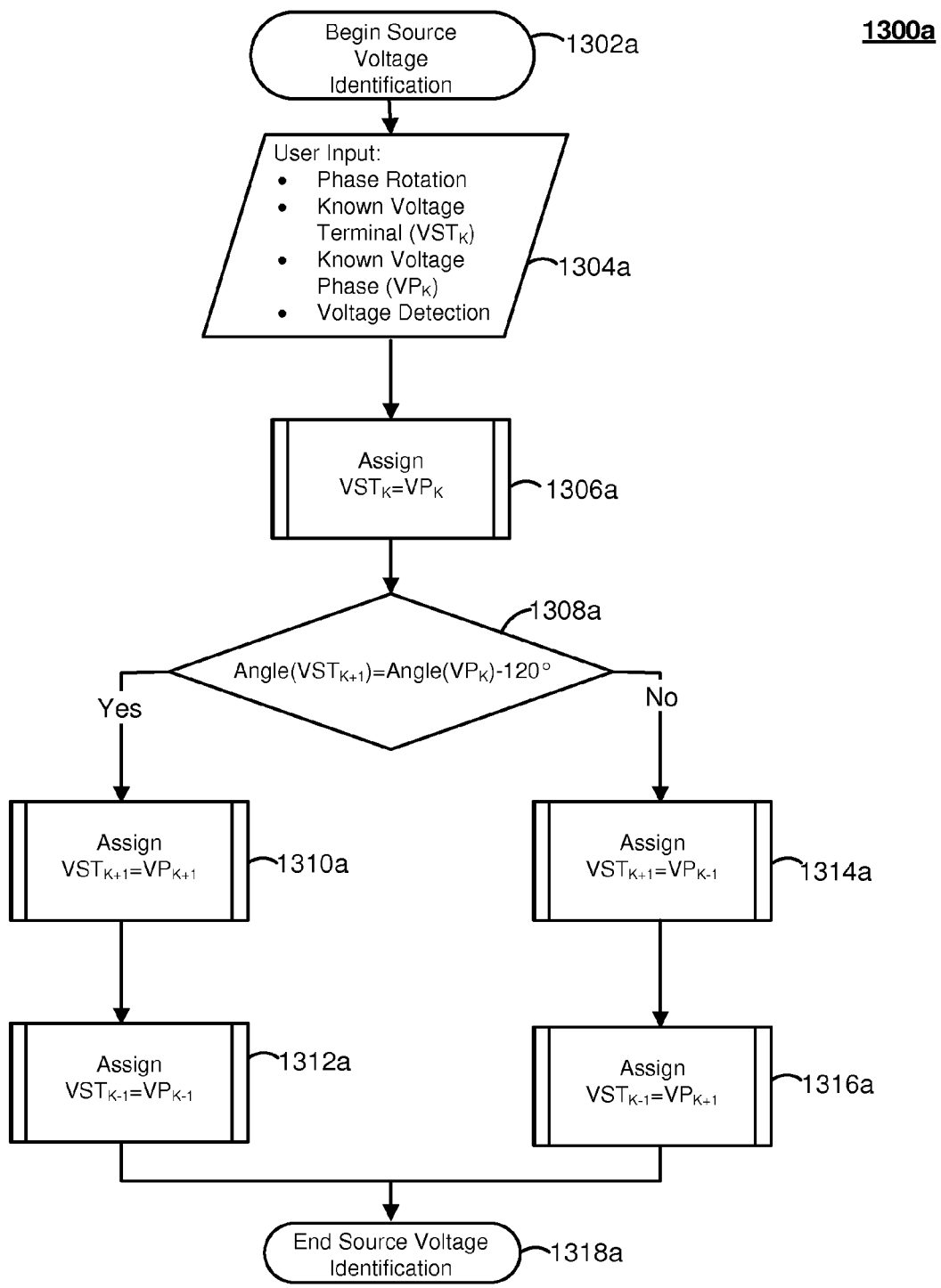
FIG. 13a is a flow chart of instructions for the IED of FIG. 5 for identifying the voltage phase and terminal for power system devices in accordance with an aspect of the present invention.

As shown in FIG. 13a, the instructions utilized by the IED 402 of FIG. 5 may include a method for identifying the phase associated with second and third source voltage terminals at a location of an electrical power system based on a known phase and known phase angle associated with a first source voltage terminal at the location of the electrical power system. Typically, at locations of the electrical power system, at least one phase of the three distribution lines would be known. For example, it is common for overhead distribution lines that the B-phase line be situated between the A-phase and C-phase lines. Typically, the other known or measured quantities include phase rotation (e.g., ABC or CBA).

In order to begin the process of identifying the phase associated with second and third source voltage terminals as shown at 1302*a*, a user would input into the IED 402 via a user input terminal or setting software the phase rotation and the known phase corresponding to the known first source voltage terminal as shown at 1304*a*. The microprocessor of the IED would assign the known first source voltage terminal with the known phase (VST$_k$=VP$_k$) as shown at 1306*a*. Next, the phase angles associated with the known first source voltage terminal (Angle (VST$_k$)) and the second source voltage terminal (Angle (VST$_{k+1}$)) are acquired. As shown in steps 1308*a*, 1310*a*, and 1312*a*, when the phase angle associated with the second source voltage terminal (VST$_{k+1}$) is about equal to the phase angle associated with the known first source voltage terminal (Angle (VST$_k$)) minus about 120°, the phase associated with the second source voltage terminal (VST$_{k+1}$) is assigned as the next sequential phase from the known phase associated with the known first source voltage terminal (VP$_{k+1}$), whereas the phase associated with the third source voltage terminal (VST$_{k-1}$) is assigned as the previous sequential phase from the known phase associated with the known first source voltage terminal (VP$_{k-1}$). As shown in steps 1308*a*, 1314*a*, and 1316*a*, when the phase angle associated with the second source voltage terminal (VST$_{k+1}$) is not about equal to the phase angle associated with the known first source voltage terminal (Angle (VST$_k$)) minus about 120°, the phase associated with the second source voltage terminal (VST$_{k+1}$) is assigned as the previous sequential phase from the known phase associated with the known source voltage terminal (VP$_{k-1}$), whereas the phase associated with the third source voltage terminal (VST$_{k-1}$) is assigned as the next sequential phase from the known phase associated with the known source voltage terminal (VP$_{k+1}$). Although FIG. 13*a* shows phase identification for only three source voltage terminals, the method outlined in this invention may be used for identifying phase values for power system arrangements having more or less unknown source voltage terminals.

Assigning the next or previous sequential phase may be based on the phase rotation. For example, for an ABC phase rotation, the next sequential phase from the B-phase is the C-phase, whereas the previous sequential phase from the B-phase is the A-phase. In another example, for a CBA phase rotation, the next sequential phase from the B-phase is the A-phase, whereas the previous sequential phase from the B-phase is the C-phase.

Figure 13B:
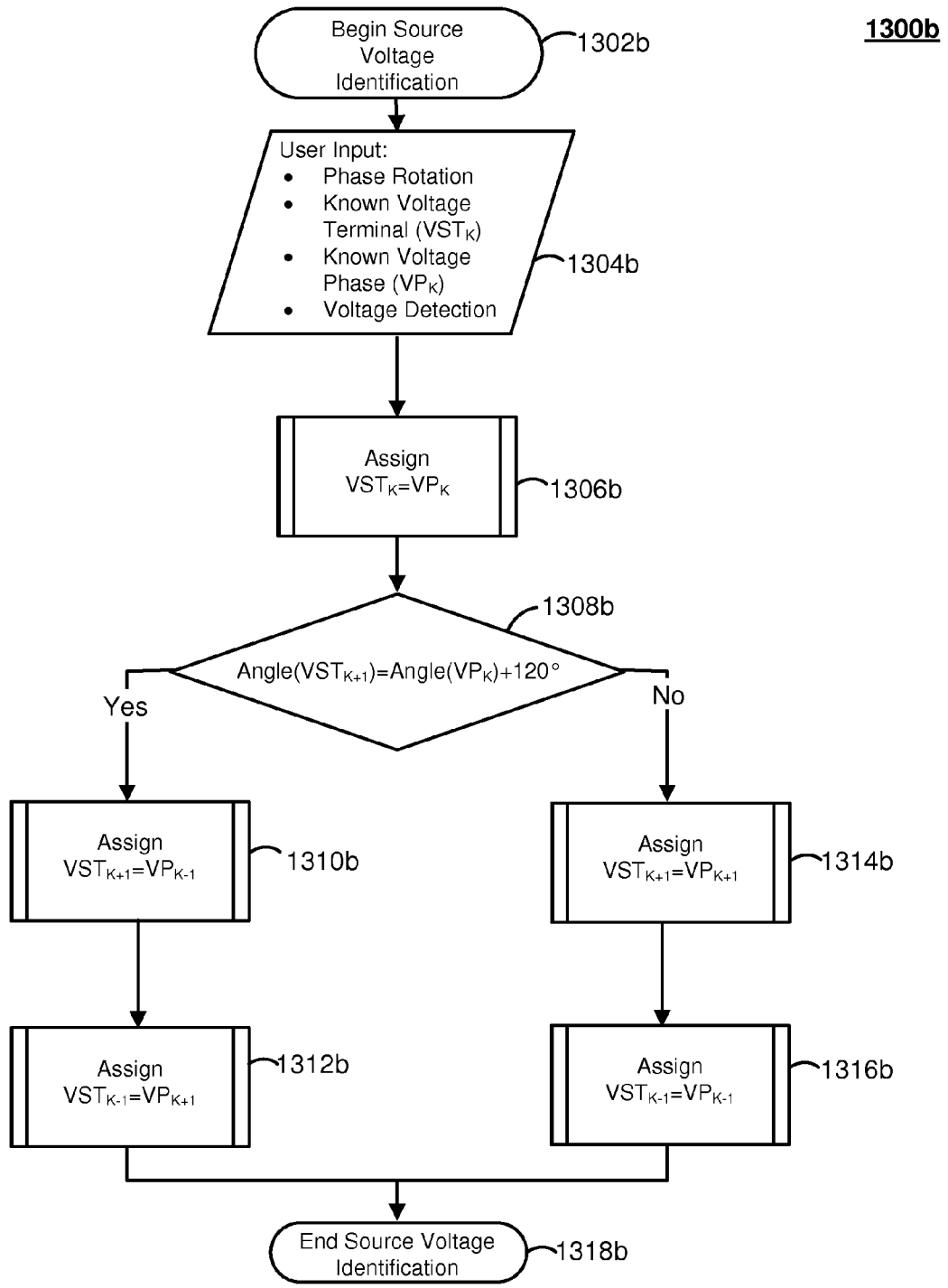
FIG. 13b is a flow chart of instructions for the IED of FIG. 5 for identifying the voltage phase and terminal for power system devices in accordance with an aspect of the present invention.
Figure 14:
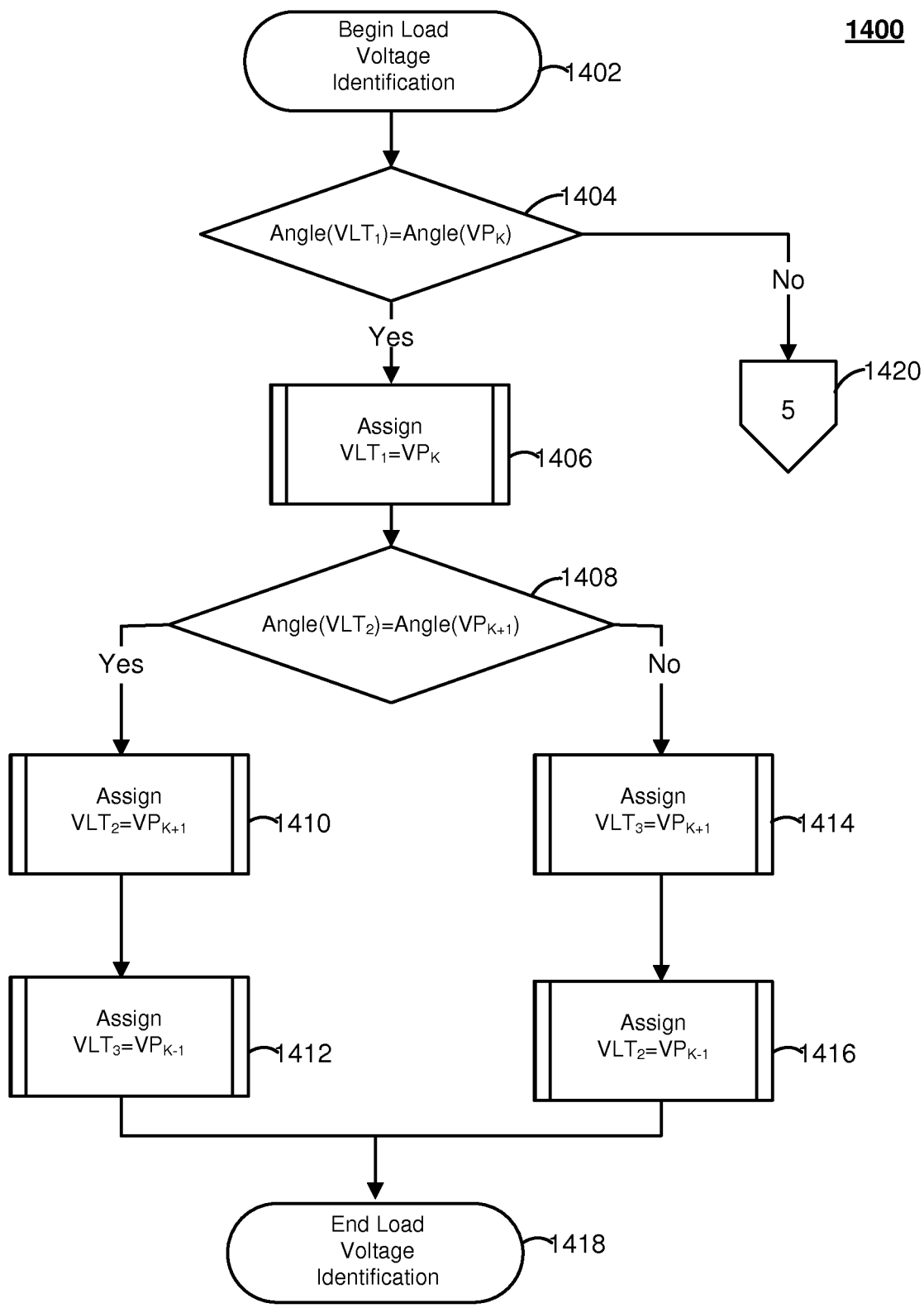
FIGS. 14 to 19 are flow charts of instructions for the IED of FIG. 5 for identifying the voltage phase and terminal for power system devices in accordance with an aspect of the present invention.
Figure 15:
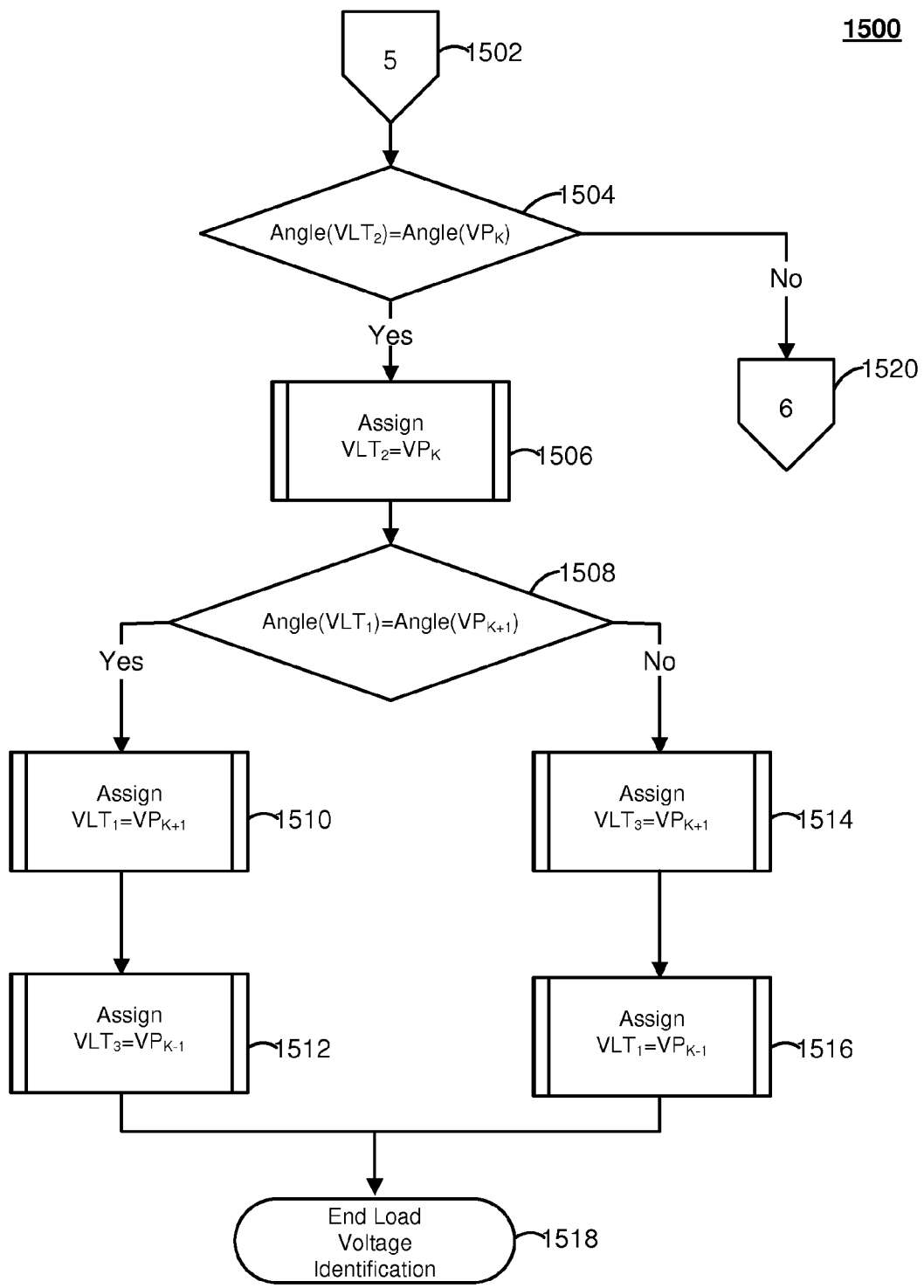
Figure 16:
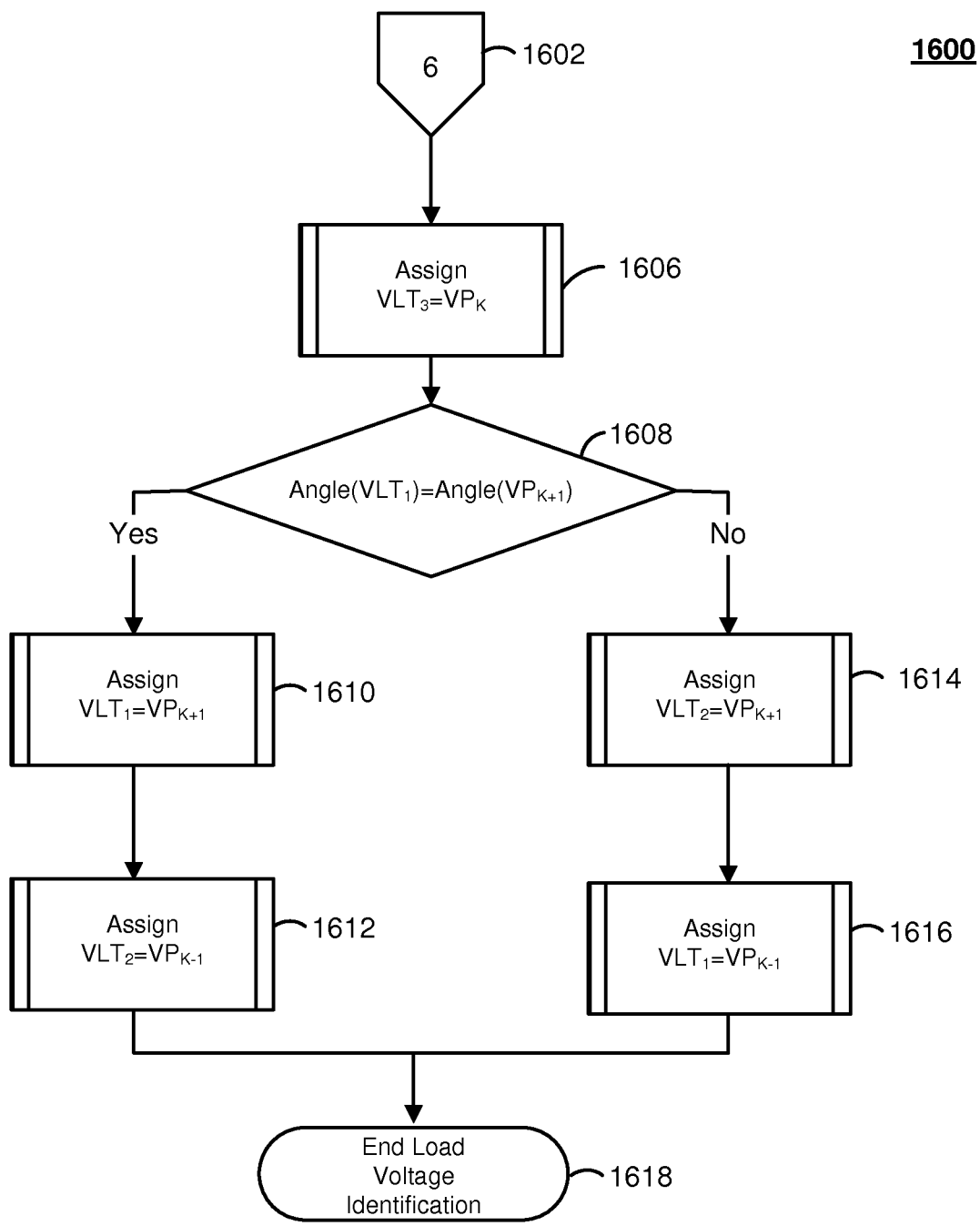
Figure 17:
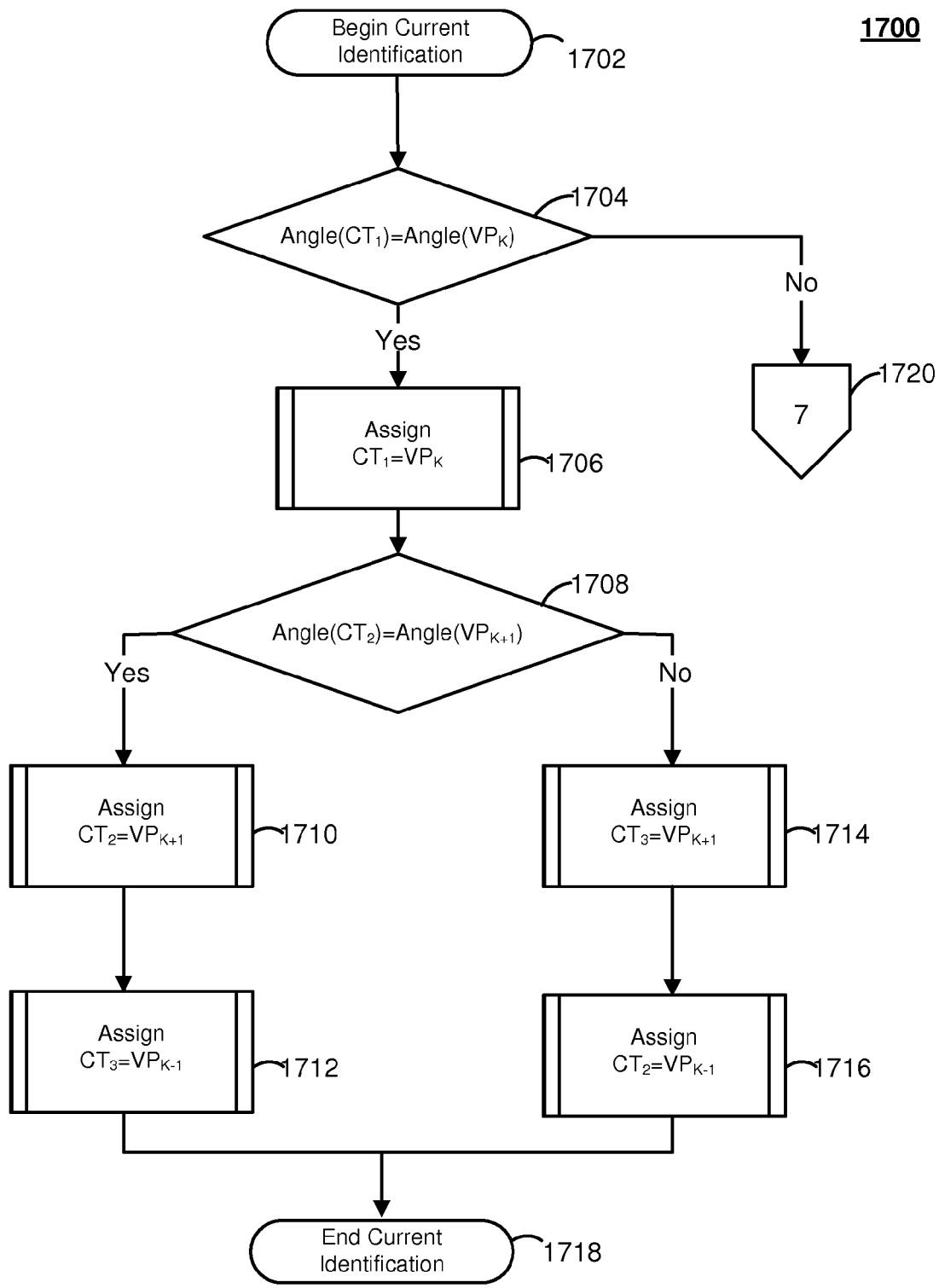
Figure 18:
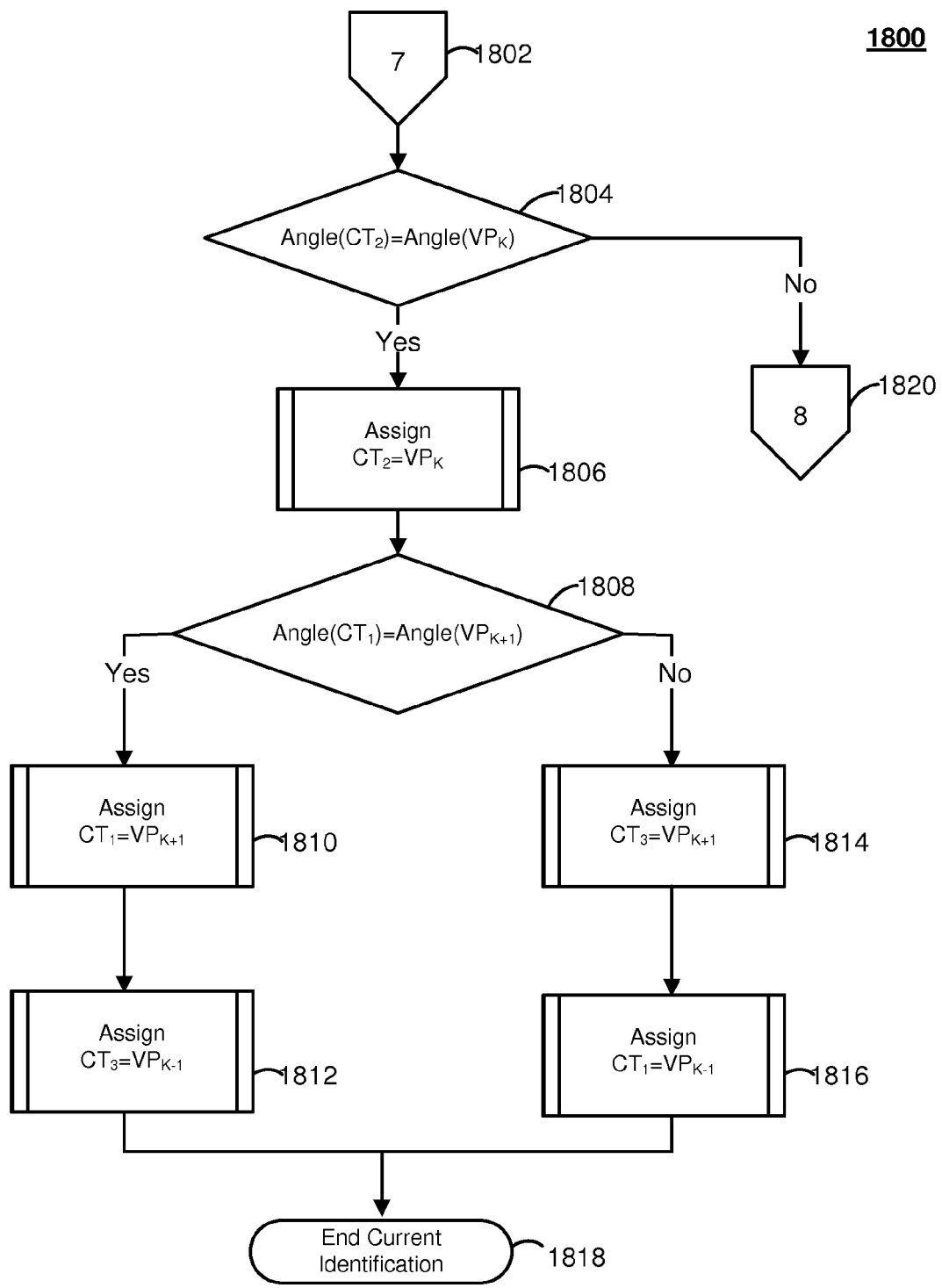
Figure 19:
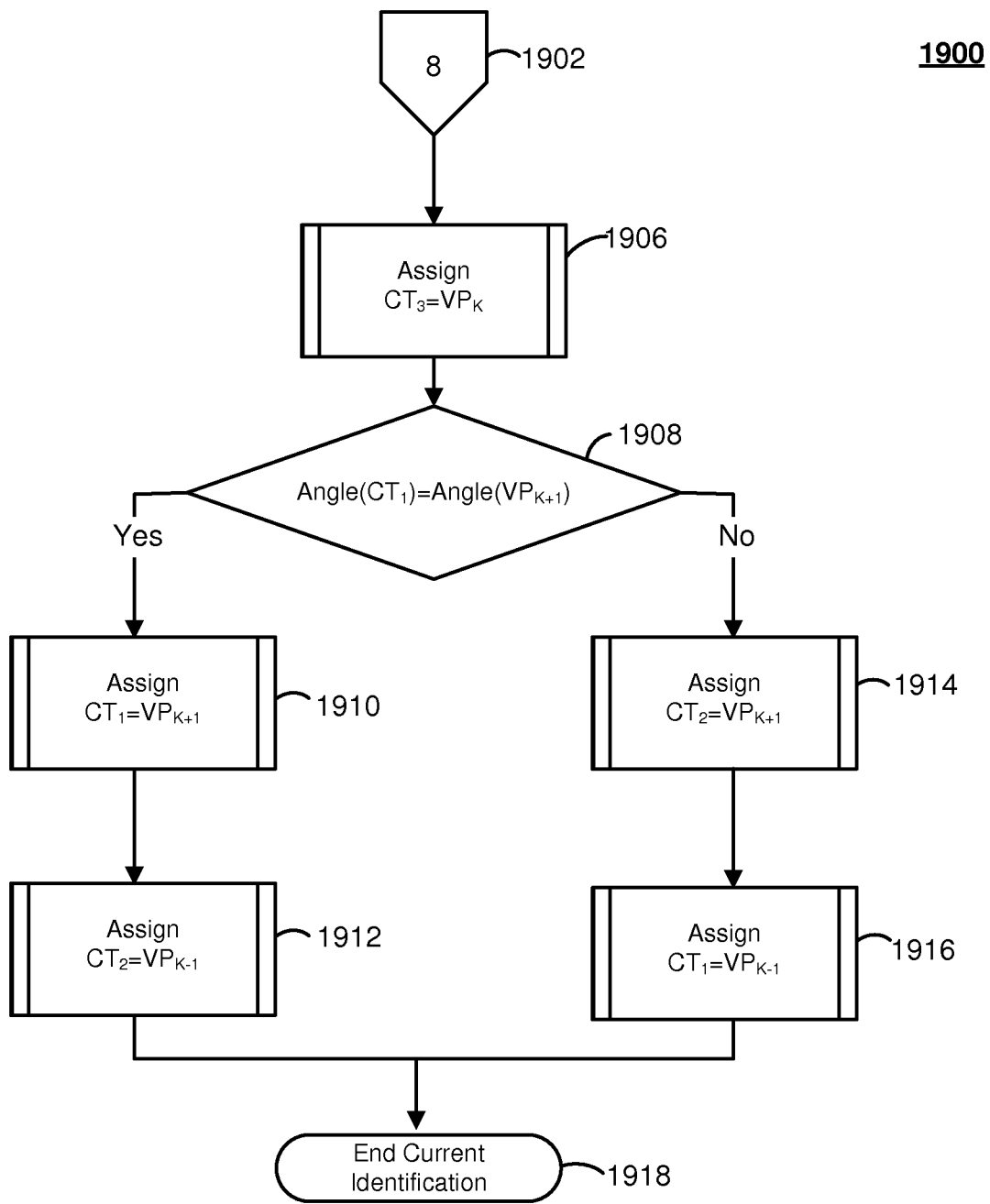

FIG. 13*b* illustrates yet another embodiment of an instructions utilized by the IED 402 for identifying the phase associated with second and third source voltage terminals at a location of an electrical power system based on a known phase and known phase angle associated with a first source voltage terminal at the location of the electrical power system. In order to begin the process of identifying the phase associated with second and third source voltage terminals as shown at 1302*b*, a user would input into the IED 402 phase rotation and the known phase corresponding to the known first source voltage terminal as shown at 1304*b*. The microprocessor of the IED would assign the known first source voltage terminal with the known phase (VST$_k$=VP$_k$) as shown at 1306*b*. Next, the phase angles associated with the first source voltage terminal (Angle (VST$_k$)) and second source voltage terminal (Angle (VST$_{k+1}$)) are acquired. As shown in steps 1308*b*, 1310*b*, and 1312*b*, when the phase angle associated with the second source voltage terminal (VST$_{k+1}$) is about equal to the phase angle associated with the known first source voltage terminal (Angle (VST$_k$)) plus about 120°, the phase associated with the second source voltage terminal (VST$_{k+1}$) is assigned as the previous sequential phase from the known phase associated with the known source voltage terminal (VP$_{k-1}$), whereas the phase associated with the third source voltage terminal (VST$_{k-1}$) is assigned as the next sequential phase from the known phase associated with the known source voltage terminal (VP$_{k+1}$). As shown in steps 1308*b*, 1314*b*, and 1316*b*, when the phase angle associated with the second source voltage terminal (VST$_{k+1}$) is not equal to the phase angle associated with the known first source voltage terminal (Angle (VST$_k$)) plus about 120°, the phase associated with the second source voltage terminal (VST$_{k+1}$) is assigned as the next sequential phase from the known phase associated with the known source voltage terminal (VP$_{k+1}$), whereas the phase associated with the third source voltage terminal (VST$_{k-1}$) is assigned as the previous sequential phase from the known phase associated with the known source voltage terminal (VP$_{k-1}$). As discussed above, assigning the next or previous sequential phase may be based on the phase rotation. Although FIG. 13*b* shows phase identification for only three source voltage terminals, the method outlined in this invention may be used for identifying phase values for power system arrangements having more or less unknown source voltage terminals.

As shown in FIGS. 14-19, the instructions utilized by the IED 402 of FIG. 5 may further include a method for identifying the phase associated with each of the load voltage terminals and current terminals at a location of an electrical power system based on the known phases of each of the source voltage terminals identified with respect to FIGS. 13*a* and 13*b*. The phases of each of the source voltage terminals approximately correspond to a phase of a load voltage or current terminal. Accordingly, the instructions described above generally include a method for determining the phase associated with a load voltage and current terminal at a location of an electrical power system based on a known phase and known phase angle associated with a source voltage terminal at the location of the power system. During this process, the phase angle associated with the load voltage or current terminal is determined. The phase angle associated with the load voltage or current terminal is then compared to the known phase angle of one of the known source voltage terminals. When the phase angle associated with the load voltage or current terminal is about equal to the phase angle associated with a particular source voltage terminal, the phase associated with the source voltage terminal is assigned as the known phase associated with that particular load voltage or current terminal as shown at 1406, 1506, 1606, 1706, 1806, 1906. When the phase angle associated with the load voltage or current terminal is not about equal to the phase angle associated with the source voltage terminal, the phase angle of another load voltage or current terminal is compared to the known phase angle of the source voltage terminal as shown at 1420, 1520, 1720, 1820.

When there is an initial match as shown at 1406, 1506, 1606, 1806, 1906, the phase angle of another load voltage or current terminal is compared to another known phase angle of another known source voltage terminal. When the phase angle associated with the other load voltage or current terminal is about equal to the other phase angle associated with the other particular source voltage terminal, the phase associated with the load voltage or current terminal is assigned as the known phase associated with that particular source voltage terminal as shown at 1410, 1510, 1610, 1710, 1810, 1910. In this case, the phase for the last remaining load voltage or current terminal is assigned as the known phase associated with the last particular source voltage terminal as shown at 1412, 1512, 1612, 1712, 1812, 1912. When the phase angle associated with the other load voltage or current terminal is not about equal to the other phase angle associated with the other particular source voltage terminal, the phase angle of the load voltage or current terminal is assigned as the known phase associated with the last particular source voltage terminal as shown at 1414, 1514, 1614, 1714, 1814, 1914. In this case, the phase for the last remaining load voltage or current terminal is assigned as the known phase associated with the other particular source voltage terminal as shown at 1416, 1516, 1616, 1716, 1816, 1916.

Although FIGS. 14-19 show phase identification for only three voltage terminals at the load and three current terminals at the load, the method outlined in this invention may be used for identifying phase values for power system arrangements having more or less unknown voltage or current terminals.

Figure 20A:
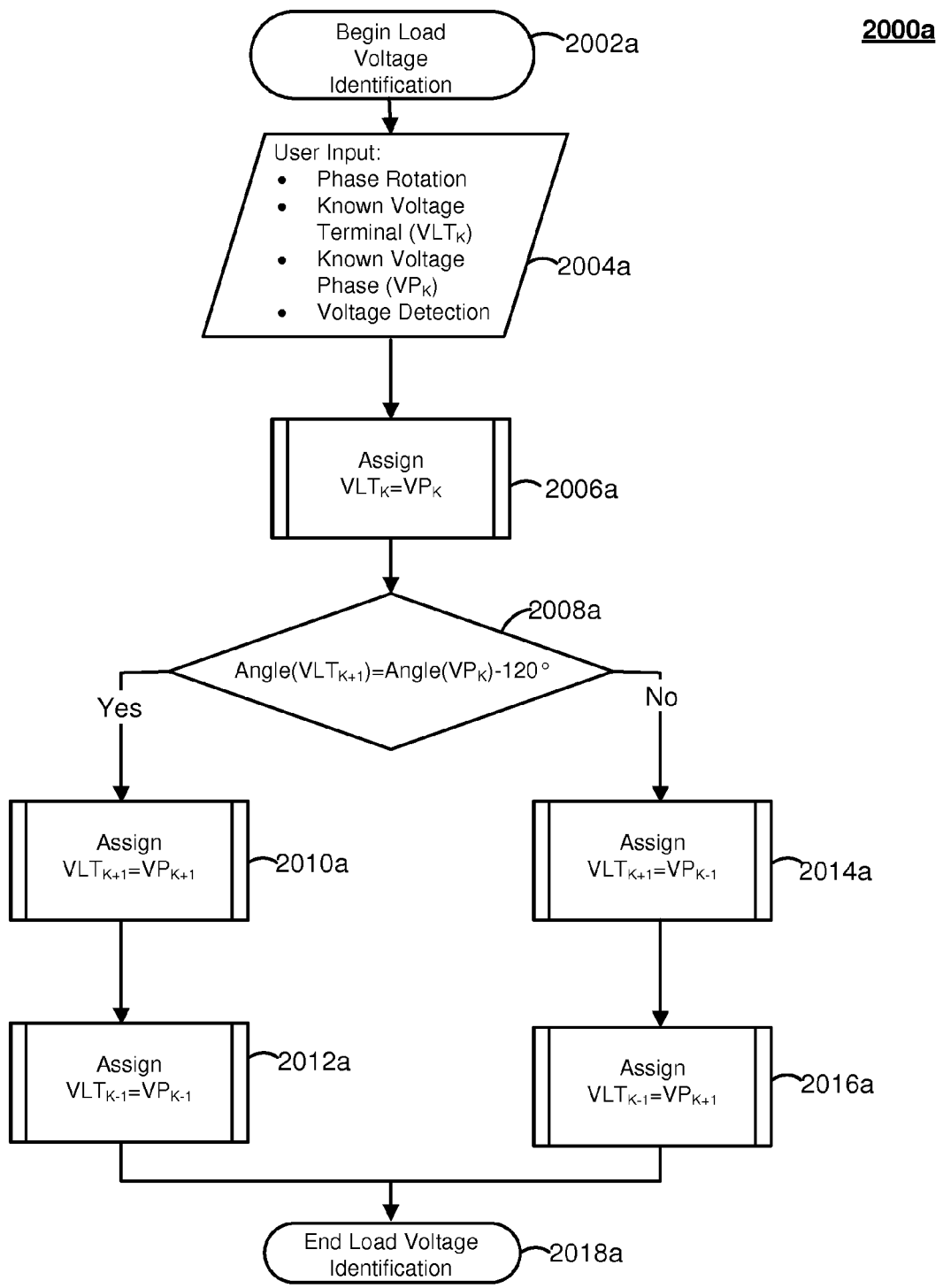
FIG. 20a is a flow chart of instructions for the IED of FIG. 5 for identifying the voltage phase and terminal for power system devices in accordance with an aspect of the present invention.

As shown in FIG. 20a, the instructions utilized by the IED 402 of FIG. 5 may include a method for identifying the phase associated with second and third load voltage terminals at a location of an electrical power system based on a known phase and known phase angle associated with a first load voltage terminal at the location of the electrical power system. Typically, at locations of the electrical power system, at least one phase of the three distribution lines would be known. For example, it is common for overhead distribution lines that the B-phase line be situated between the A-phase and C-phase lines. Typically, the other known or measured quantities include phase rotation (e.g., ABC or CBA).

In order to begin the process of identifying the phase associated with second and third load voltage terminals as shown at 2002a, a user would input into the IED 402 via a user input terminal or setting software the phase rotation and the known phase corresponding to the known first load voltage terminal as shown at 2004a. The microprocessor of the IED would assign the known first load voltage terminal with the known phase ($VLT_k = VP_k$) as shown at 2006a. Next, the phase angles associated with the known first load voltage terminal (Angle ($VLT_k$)) and the second load voltage terminal (Angle ($VLT_{k+1}$)) are acquired. As shown in steps 2008a, 2010a, and 2012a, when the phase angle associated with the second load voltage terminal ($VLT_{k+1}$) is about equal to the phase angle associated with the known first load voltage terminal (Angle ($VLT_k$)) minus about 120°, the phase associated with the second load voltage terminal ($VLT_{k+1}$) is assigned as the next sequential phase from the known phase associated with the known first load voltage terminal ($VP_{k+1}$), whereas the phase associated with the third load voltage terminal ($VLT_{k-1}$) is assigned as the previous sequential phase from the known phase associated with the known first load voltage terminal ($VP_{k-1}$). As shown in steps 2008a, 2014a, and 2016a, when the phase angle associated with the second load voltage terminal ($VLT_{k+1}$) is not about equal to the phase angle associated with the known first load voltage terminal (Angle ($VLT_k$)) minus about 120°, the phase associated with the second load voltage terminal ($VLT_{k+1}$) is assigned as the previous sequential phase from the known phase associated with the known load voltage terminal ($VP_{k-1}$), whereas the phase associated with the third load voltage terminal ($VLT_{k-1}$) is assigned as the next sequential phase from the known phase associated with the known load voltage terminal ($VP_{k+1}$). Although FIG. 20a shows phase identification for only three load voltage terminals, the method outlined in this invention may be used for identifying phase values for power system arrangements having more or less unknown load voltage terminals.

Assigning the next or previous sequential phase may be based on the phase rotation. For example, for an ABC phase rotation, the next sequential phase from the B-phase is the C-phase, whereas the previous sequential phase from the B-phase is the A-phase. In another example, for a CBA phase rotation, the next sequential phase from the B-phase is the A-phase, whereas the previous sequential phase from the B-phase is the C-phase.

Figure 20B:
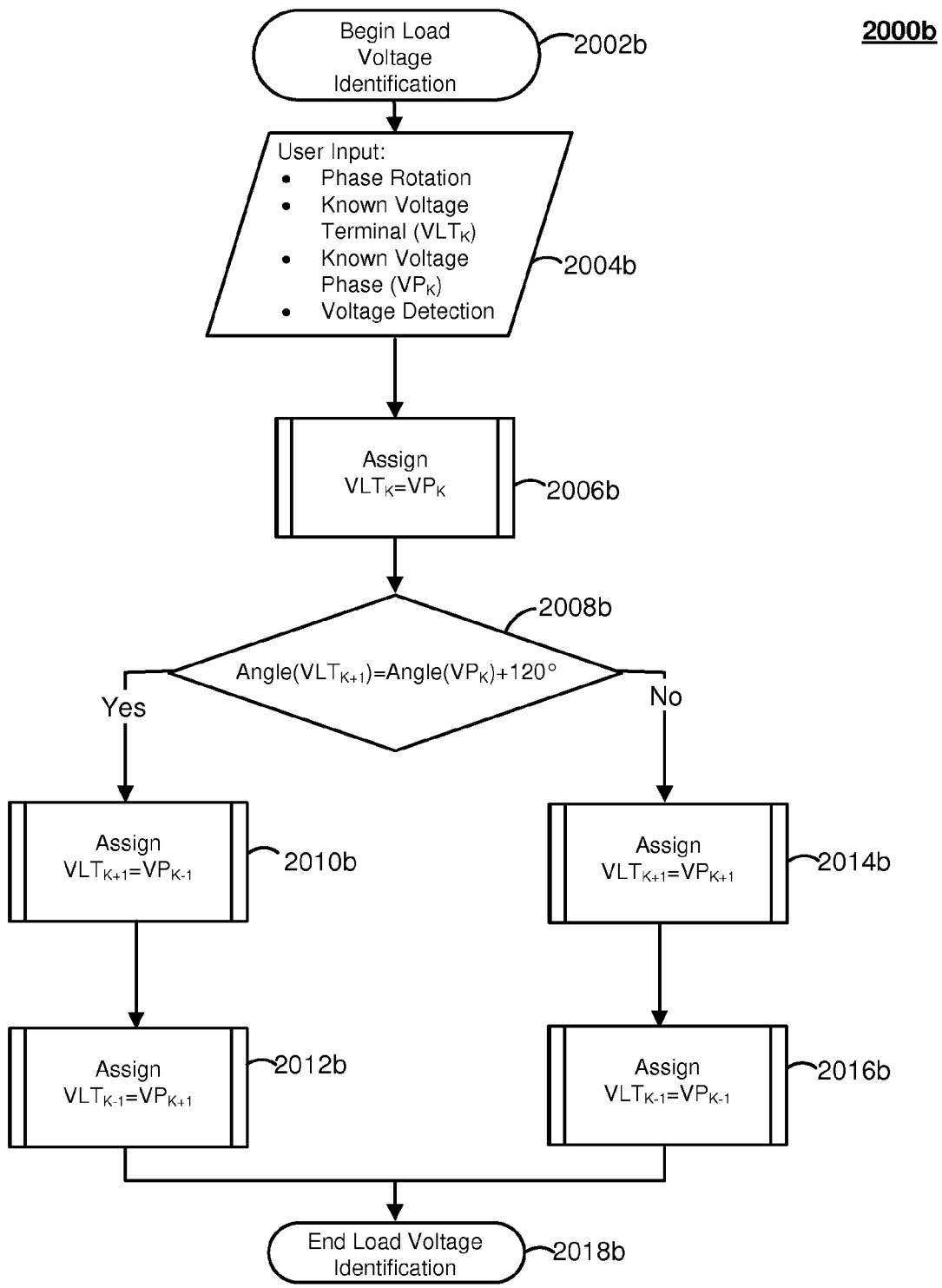
FIG. 20b is a flow chart of instructions for the IED of FIG. 5 for identifying the voltage phase and terminal for power system devices in accordance with an aspect of the present invention.
Figure 21:
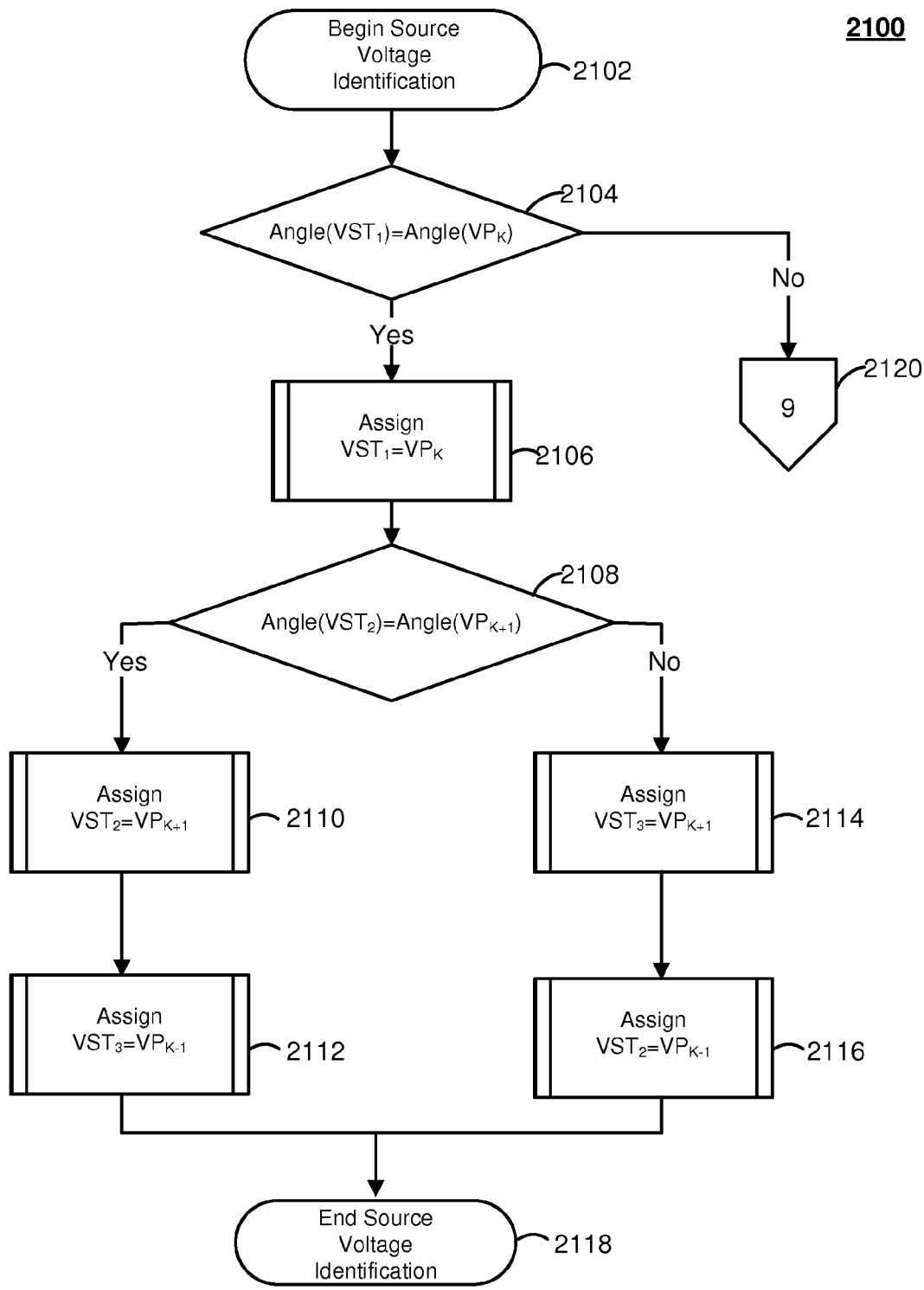
FIGS. 21 to 26 are flow charts of instructions for the IED of FIG. 5 for identifying the voltage phase and terminal for power system devices in accordance with an aspect of the present invention.
Figure 22:
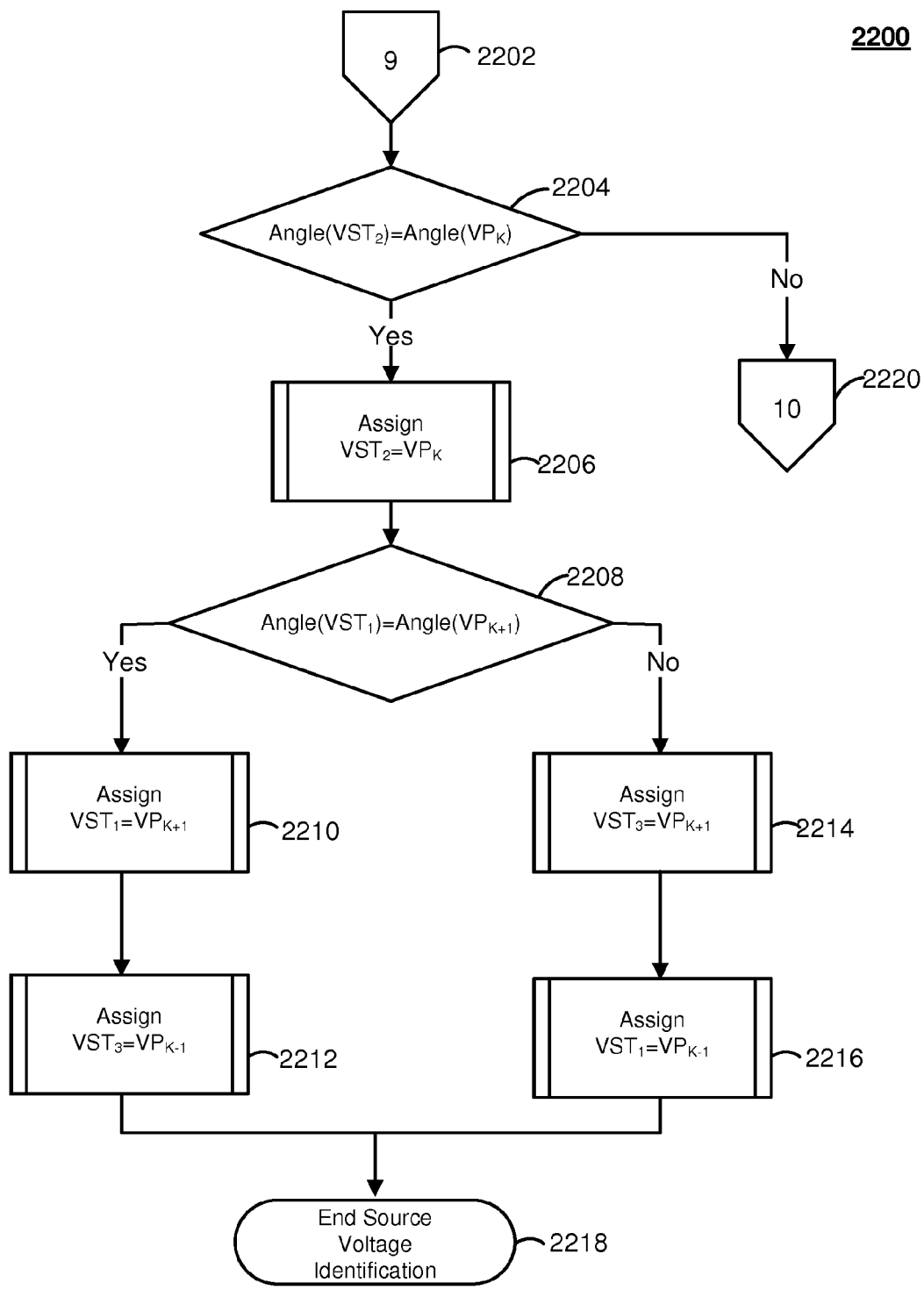
Figure 23:
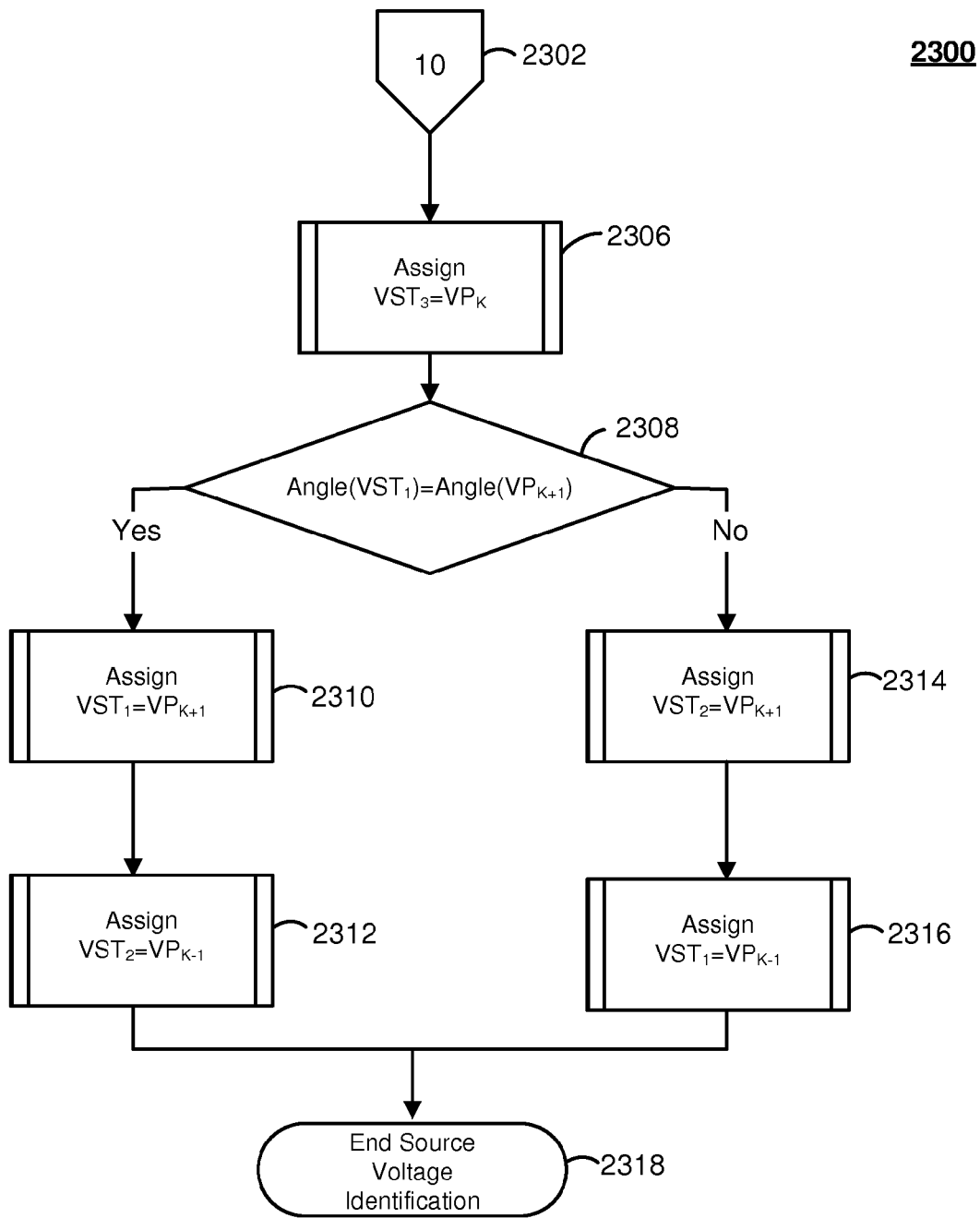
Figure 24:
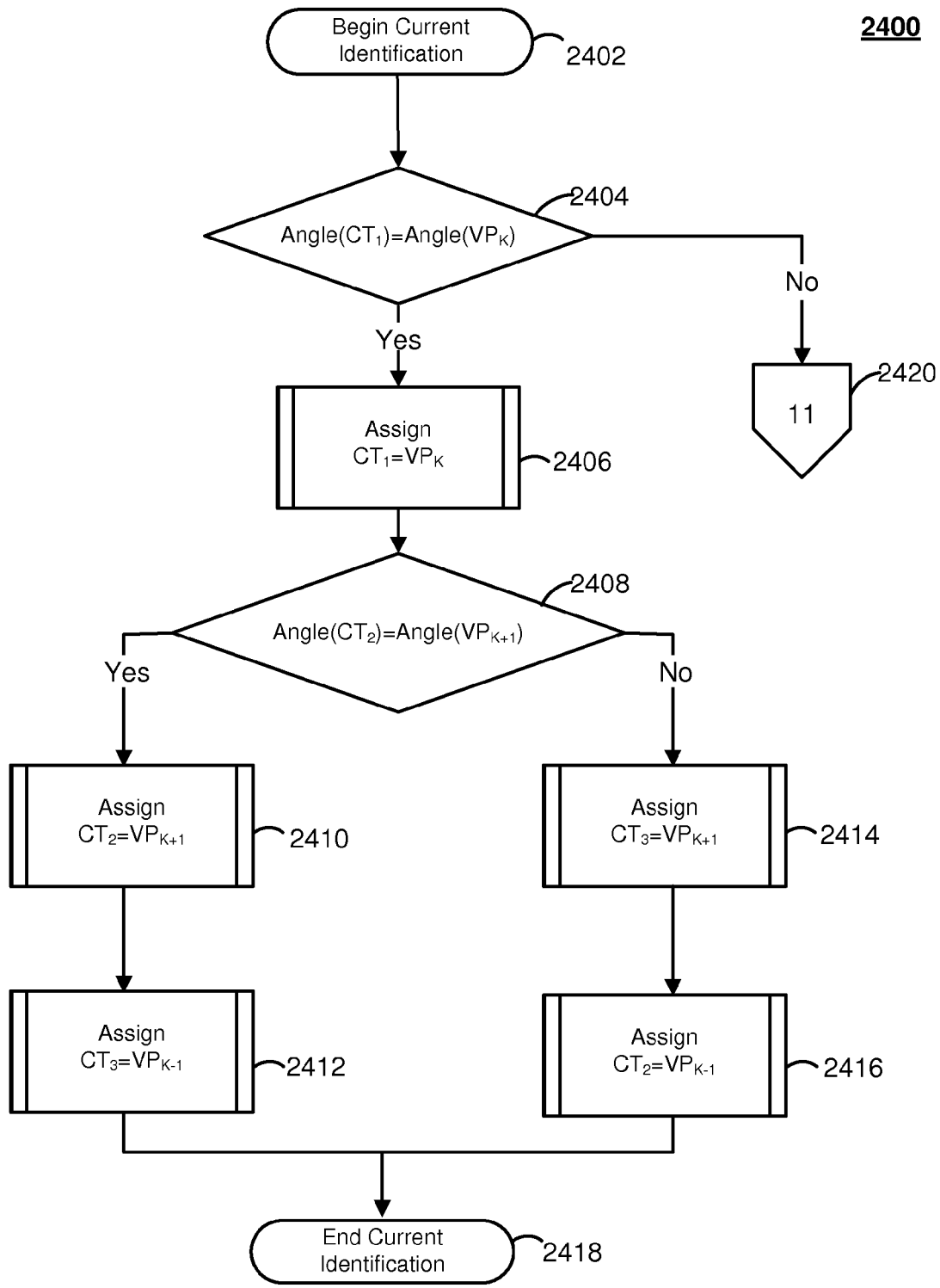
Figure 25:
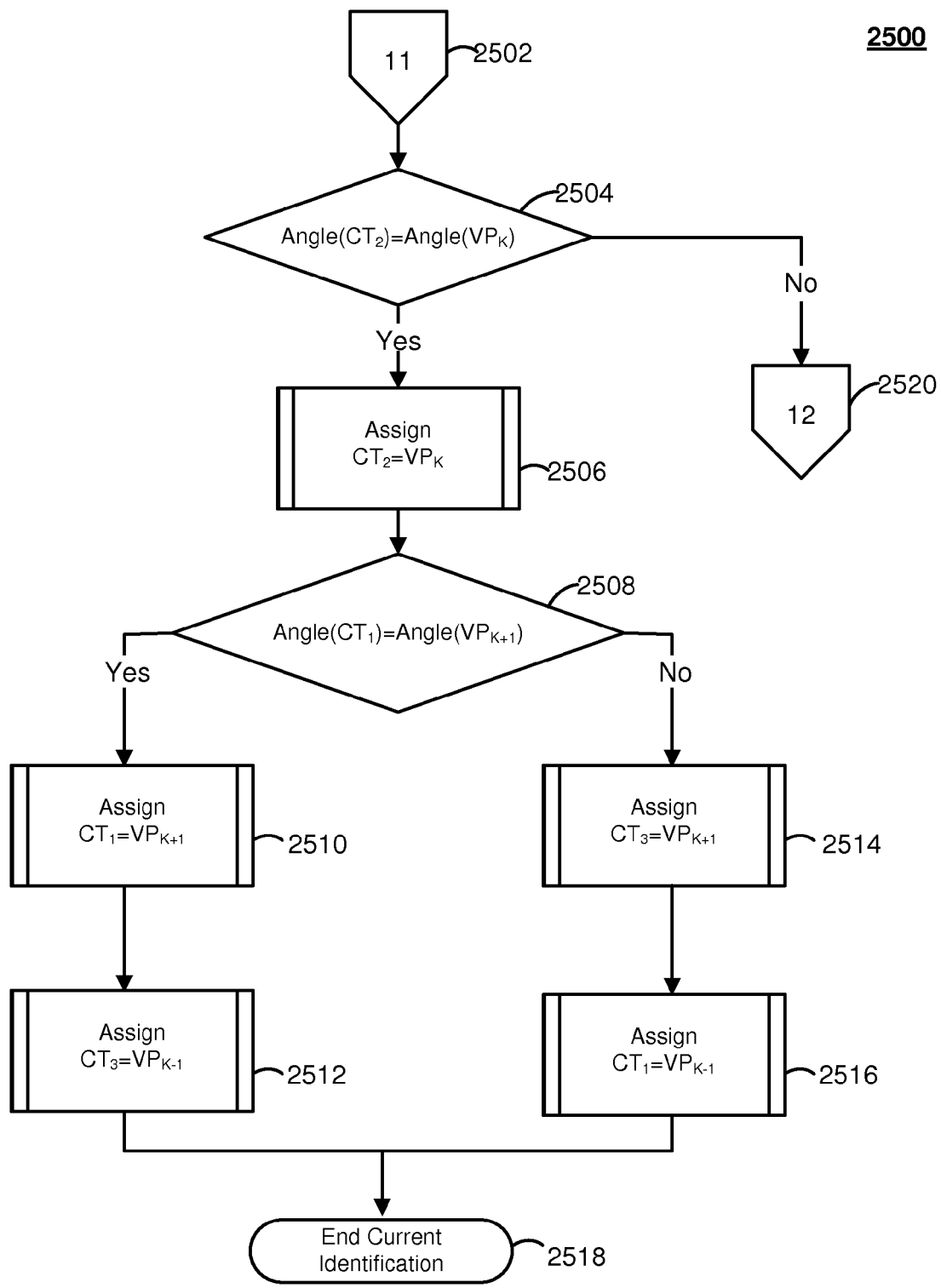
Figure 26:
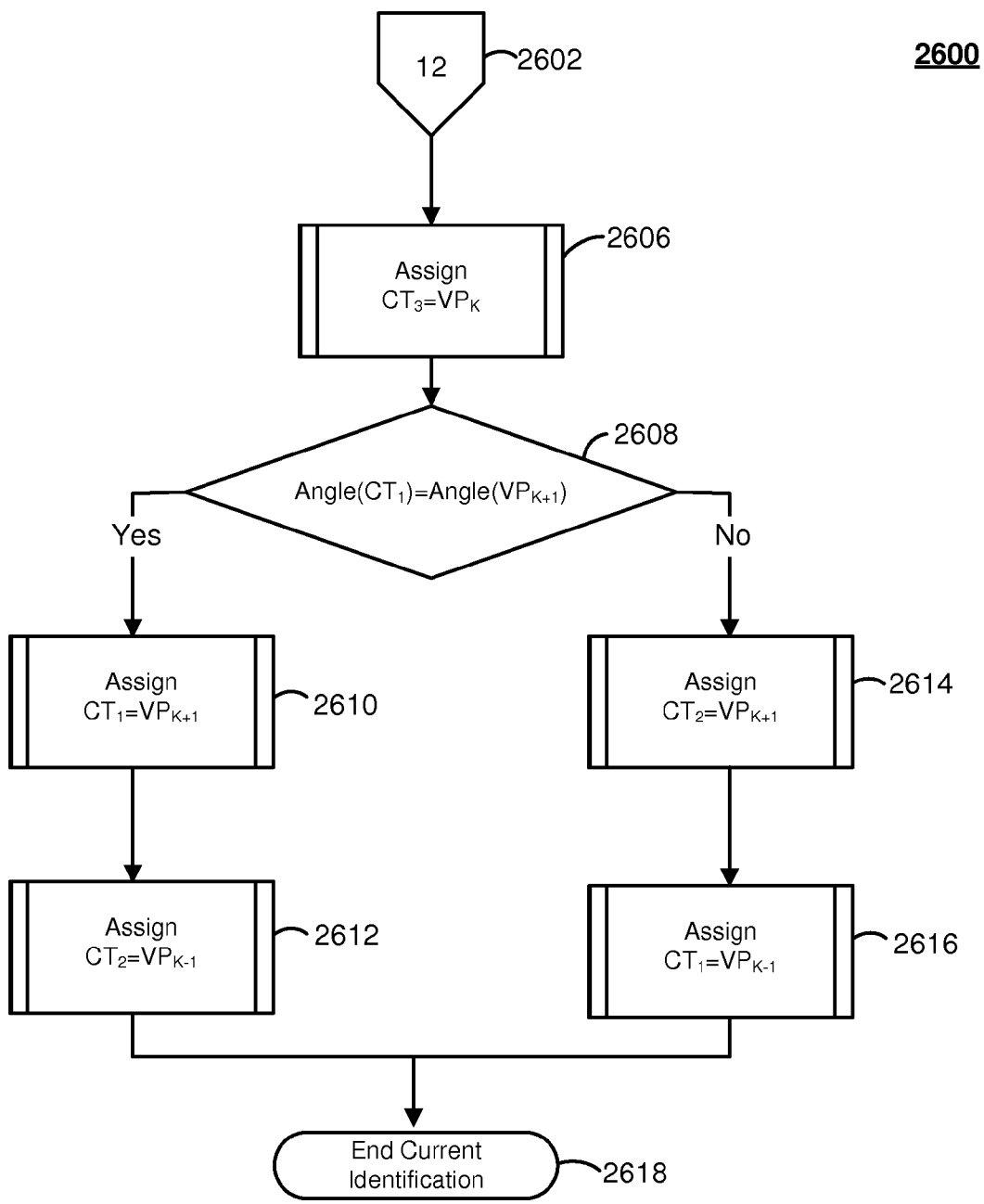

FIG. 20b illustrates yet another embodiment of a instructions which may be utilized by the IED 402 for identifying the phase associated with second and third load voltage terminals at a location of an electrical power system based on a known phase and known phase angle associated with a first load voltage terminal at the location of the electrical power system. In order to begin the process of identifying the phase associated with second and third load voltage terminals as shown at 2002b, a user would input into the IED 402 phase rotation and the known phase corresponding to the known first load voltage terminal as shown at 2004b. The microprocessor of the IED would assign the known first load voltage terminal with the known phase ($VLT_k = VP_k$) as shown at 2006b. Next, the phase angles associated with the first load voltage terminal (Angle ($VLT_k$)) and second load voltage terminal (Angle ($VLT_{k+1}$)) are acquired. As shown in steps 2008b, 2010b, and 2012b, when the phase angle associated with the second load voltage terminal ($VLT_{k+1}$) is about equal to the phase angle associated with the known first load voltage terminal (Angle ($VLT_k$)) plus about 120°, the phase associated with the second load voltage terminal ($VLT_{k+1}$) is assigned as the previous sequential phase from the known phase associated with the known load voltage terminal ($VP_{k-1}$), whereas the phase associated with the third load voltage terminal ($VLT_{k-1}$) is assigned as the next sequential phase from the known phase associated with the known load voltage terminal ($VP_{k+1}$). As shown in steps 2008b, 2014b, and 2016b, when the phase angle associated with the second load voltage terminal ($VLT_{k+1}$) is not equal to the phase angle associated with the known first load voltage terminal (Angle ($VLT_k$)) plus about 120°, the phase associated with the second load voltage terminal ($VLT_{k+1}$) is assigned as the next sequential phase from the known phase associated with the known load voltage terminal ($VP_{k+1}$), whereas the phase associated with the third load voltage terminal ($VLT_{k-1}$) is assigned as the previous sequential phase from the known phase associated with the known load voltage terminal ($VP_{k-1}$). As discussed above, assigning the next or previous sequential phase may be based on the phase rotation. Although FIG. 20b shows phase identification for only three load voltage terminals, the method outlined in this invention may be used for identifying phase values for power system arrangements having more or less unknown load voltage terminals.

As shown in FIGS. 21-26, the instructions utilized by the IED 402 of FIG. 5 may further include a method for identifying the phase associated with each of the source voltage terminals and current terminals at a location of an electrical power system based on the known phases of each of the load voltage terminals identified with respect to FIGS. 20a and 20b. The phases of each of the load voltage terminals approximately correspond to a phase of a source voltage or current terminal. Accordingly, the instructions generally include a method for determining the phase associated with a source voltage and current terminal at a location of an electrical power system based on a known phase and known phase angle associated with a load voltage terminal at the location of the power system. During this process, the phase angle associated with the source voltage or current terminal is determined. The phase angle associated with the source voltage or current terminal is then compared to the known phase angle of one of the known load voltage terminals. When the phase angle associated with the source voltage or current terminal is about equal to the phase angle associated with a particular load voltage terminal, the phase associated with the load voltage terminal is assigned as the known phase associated with that particular source voltage or current terminal as shown at 2106, 2206, 2306, 2406, 2506, 2606. When the phase angle associated with the source voltage or current terminal is not about equal to the phase angle associated with the load voltage terminal, the phase angle of another source voltage or current terminal is compared to the known phase angle of the load voltage terminal as shown at 2120, 2220, 2420, 2520.

When there is an initial match as shown at 2106, 2206, 2306, 2506, 2606, the phase angle of another source voltage or current terminal is compared to another known phase angle of another known load voltage terminal. When the phase angle associated with the other source voltage or current terminal is about equal to the other phase angle associated with the other particular load voltage terminal, the phase associated with the source voltage or current terminal is assigned as the known phase associated with that particular load voltage terminal as shown at 2110, 2210, 2310, 2410, 2510, 2610. In this case, the phase for the last remaining source voltage or current terminal is assigned as the known phase associated with the last particular load voltage terminal as shown at 2112, 2212, 2312, 2412, 2512, 2612. When the phase angle associated with the other source voltage or current terminal is not about equal to the other phase angle associated with the other particular load voltage terminal, the phase angle of the source voltage or current terminal is assigned as the known phase associated with the last particular load voltage terminal as shown at 2114, 2214, 2314, 2414, 2514, 2614. In this case, the phase for the last remaining source voltage or current terminal is assigned as the known phase associated with the other particular load voltage terminal as shown at 2114, 2214, 2314, 2414, 2514, 2614.

Although FIGS. 21-26 show phase identification for only three voltage terminals at the source and three current terminals at the load, the method outlined in this invention may be used for identifying phase values for power system arrangements having more or less unknown voltage or current terminals.

Using the instructions for identifying the phases for the voltage and current terminals, the IED 402 may in turn be configured to acquire and otherwise process data from each of the terminals in order to provide protection functionality, automation, metering, monitoring, and control actions associated therewith.

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. Furthermore, it will be appreciated that any such changes and modifications will be recognized by those skilled in the art as an equivalent to one or more elements of the following claims, and shall be covered by such claims to the fullest extent permitted by law.

The invention claimed is:

1. A method for determining a phase associated with first and second current terminals of an intelligent electronic device ("IED") at a location of an electrical power system based on a known phase and known phase angle associated with a third current terminal of the IED at the location of the electrical power system, the method comprising the steps of:

the IED determining a phase angle associated with the first current terminal, when the phase angle associated with the first current terminal is equal to the known phase angle associated with the third current terminal minus about 120 degrees, the IED associating the first current terminal with a next sequential phase from the known phase associated with the third current terminal and the IED associating the second current terminal with a previous sequential phase from the known phase associated with the third current terminal, and when the phase angle associated with the first current terminal is not equal to the known phase angle associated with the third current terminal minus about 120 degrees, the IED associating the first current terminal with the previous sequential phase from the known phase associated with the third current terminal and the IED associating the second current terminal with the next sequential phase from the known phase associated with the third current terminal.

2. A method for determining a phase associated with first and second current terminals of an intelligent electronic device ("IED") at a location of an electrical power system based on a known phase and known phase angle associated with a third current terminal of the IED at the location of the electrical power system, the method comprising the steps of:

the IED determining a phase angle associated with the first current terminal, when the phase angle associated with the first current terminal is equal to the known phase angle associated with the third current terminal plus about 120 degrees, the IED associating the first current terminal with a previous sequential phase from the known phase associated with the third current terminal and the IED associating the second current terminal with a next sequential phase from the known phase associated with the third current terminal, and when the phase angle associated with the first current terminal is not equal to the known phase angle associated with the third current terminal plus about 120 degrees, the IED associating the first current terminal with the next sequential phase from the known phase associated with the third current terminal and the IED associating the second current terminal with the previous sequential phase from the known phase associated with the third current terminal.

3. A method for determining which phase is associated with a first and a second voltage terminal of an intelligent electronic device ("IED") at a location of an electrical power system based on known phase and known phase angles associated with a first and a second current terminal of the IED at the location of the electrical power system, the method comprising the steps of:

the IED determining the phase angle associated with the first voltage terminal, when the phase angle associated with the first voltage terminal is equal to the phase angle associated with the first current terminal, the IED associating the first voltage terminal with the same phase as the known phase associated with the first current terminal, the IED determining a phase angle associated with the second voltage terminal, and when the phase angle associated with the second voltage terminal is equal to the phase angle associated with the second current terminal, the IED associating the second voltage terminal with the same phase as the known phase associated with the second current terminal.

4. A method for determining the phase associated with first, second and third voltage terminals of an intelligent electronic device ("IED") at a location of an electrical power system based on known phase and known phase angles associated with first, second and third current terminals of the IED at the location of the electrical power system, the method comprising the steps of:
- the IED determining a phase angle associated with the first voltage terminal,
- when the phase angle associated with the first voltage terminal is equal to the phase angle associated with one of the first, second, and third current terminals, the IED associating the first voltage terminal with the phase associated with the one of the first, second, and third current terminals whose known phase angle is equal to the phase angle of the first voltage terminal,
- the IED determining a phase angle associated with the second voltage terminal,
- when the phase angle associated with the second voltage terminal is equal to the phase angle associated with one of the first, second, and third current terminals, the IED associating the second voltage terminal with the phase associated with the one of the first, second, and third current terminals whose known phase angle is equal to the phase angle of the second voltage terminal, and
- the IED associating the third voltage terminal with a phase associated with the current terminal whose known phase is not associated with the first or second voltage terminals.

5. A method for determining a phase associated with a first, second and third voltage terminals of an intelligent electronic device ("IED") at a location of an electrical power system based on known phase and known phase angles associated with a third voltage terminal of the IED at the location of the electrical power system, the method comprising the steps of:
- the IED determining a phase angle associated with the first voltage terminal,
- when the phase angle associated with the first voltage terminal is equal to the known phase angle associated with the third voltage terminal minus about 120 degrees, the IED associating the first voltage terminal with a next sequential phase from the known phase associated with the third voltage terminal and the IED associating the second voltage terminal with a previous sequential phase from the known phase associated with the third voltage terminal,
- when the phase angle associated with the first voltage terminal is not equal to the known phase angle associated with the third voltage terminal minus about 120 degrees, the IED associating the first voltage terminal with the previous sequential phase from the known phase associated with the third voltage terminal and the IED associating the second voltage terminal with the previous sequential phase from the known phase associated with the third voltage terminal.

6. An apparatus for determining a phase associated with first and second current terminals at a location of an electrical power system based on a known phase and known phase angle associated with a third current terminal at the location of the electrical power system, the apparatus comprising:
- an input terminal for entering the known phase angle associated with the third current terminal, and
- a microprocessor coupled to the input terminal, said microprocessor adapted to:
  - associate the first current terminal with a next sequential phase from the known phase associated with the third current terminal and assign the second current terminal with a previous sequential phase from the known phase associated with the third current terminal when a phase angle associated with the first current terminal is equal to the known phase angle associated with the third current terminal minus about 120 degrees, and
  - associate the first current terminal with a previous sequential phase from the known phase associated with the third current terminal and assign the second current terminal with a next sequential phase from the known phase associated with the third current terminal when the phase angle associated with the first current terminal is not equal to the known phase angle associated with the third current terminal minus about 120 degrees.

7. The apparatus of claim 6 wherein the microprocessor assigns the current terminal connection to another power system apparatus.

8. The apparatus of claim 7 wherein the other power system apparatus is a circuit breaker.

9. The apparatus of claim 7 wherein the other power system apparatus is a recloser.

10. The apparatus of claim 6 further including a memory location for storing instructions for the microprocessor.

11. The apparatus of claim 10 wherein the instructions for the microprocessor include instructions for assigning further including a memory location for storing instructions for determining the phase associated with first and second current terminals based on the known phase and known phase angle associated with the third current terminal at the location of the electrical power system.

12. The apparatus of claim 10 wherein the instructions for the microprocessor include instructions for control, monitoring, automation or protection functions.

13. The apparatus of claim 6 further including instructions for identifying and configuring a three-phase current connection.

14. The apparatus of claim 6 further including a binary output adapted to provide control, monitoring, automation or protection signals from the microprocessor to another power system device.

15. An apparatus for determining which phase associated with a first, a second and a third voltage terminal at a location of an electrical power system based on known phase and known phase angles associated with first, second and third current terminals at the location of the electrical power system, the apparatus comprising:
- an input terminal for entering the phase angle associated with the first and second current terminals,
- a microprocessor coupled to the input terminal, said microprocessor adapted to:
  - associate the first voltage terminal with the same phase as the phase associated with one of the first, second, and third current terminals whose known phase angle is equal to the phase angle associated with the first voltage terminal,
  - associate the second voltage terminal with the same phase as the phase associated with one of the first, second, and third current terminals whose known phase angle is equal to the phase angle associated with the second voltage terminal, and
  - associate the third voltage terminal with a phase associated with the current terminal with a known phase not associated with the first or second voltage terminals.

16. The apparatus of claim 15 wherein the apparatus is associated with a power system element.

17. The apparatus of claim 16 wherein the power system element comprises a circuit breaker.

18. The apparatus of claim 16 wherein the power system element comprises a recloser.

19. The apparatus of claim 15 further including a memory location for storing instructions for the microprocessor.

20. The apparatus of claim 19 wherein the instructions for the microprocessor include instructions for determining the phase associated with first, second and third voltage terminals based on known phase and known phase angles associated with first, second and third current terminals at the location of the electrical power system.

21. The apparatus of claim 19 wherein the instructions for the microprocessor include instructions for control, monitoring, automation or protection functions.

22. The apparatus of claim 15 further including instructions for identifying and configuring a three-phase voltage connection.

23. The apparatus of claim 15 further including a binary output adapted to provide control, monitoring, automation or protection signals from the microprocessor to another power system device.

24. A method for determining a phase associated with a first, second and third voltage terminals of an intelligent electronic device ("IED") at a location of an electrical power system based on known phase and known phase angles associated with a third voltage terminal of the IED at the location of the electrical power system, the method comprising the steps of:
    the IED determining a phase angle associated with the first voltage terminal,
    when the phase angle associated with the first voltage terminal is equal to the known phase angle associated with the third voltage terminal plus about 120 degrees, the IED associating the first voltage terminal with a next sequential phase from the known phase associated with the third voltage terminal and the IED associating the second voltage terminal with a previous sequential phase from the known phase associated with the third voltage terminal,
    when the phase angle associated with the first voltage terminal is not equal to the known phase angle associated with the third voltage terminal plus about 120 degrees, the IED associating the first voltage terminal with the previous sequential phase from the known phase associated with the third voltage terminal and the IED associating the second voltage terminal with the previous sequential phase from the known phase associated with the third voltage terminal.

25. A method for determining a phase of an electrical power system associated with a first terminal of an electric power system device based on a known phase rotation and known phase associated with a second terminal of the electric power system device, the method comprising the steps of:
    the electric power system device determining a phase angle associated with the second terminal and a phase angle associated with the first terminal;
    when the phase angle associated with the first terminal is equal to the phase angle associated with the second terminal plus about 120 degrees, associating the first terminal to a next phase in the known phase rotation; and,
    when a phase angle associated with the first terminal is equal to the phase angle associated with the second terminal minus about 120 degrees, associating the first terminal to a previous phase in the known phase rotation.

26. A method for determining a phase of an electrical power system associated with a first terminal of an electric power system device based on a known phase and a known phase angle associated with a second terminal of the electric power system device, the method comprising the steps of:
    the electric power system device determining a phase angle associated with the first terminal of the electric power system;
    when the phase angle associated with the first terminal of the electric power system is equal to the known phase angle associated with the second terminal of the electric power system device, associating the first terminal with the same phase as the known phase associated with the second terminal.

* * * * *